(12) United States Patent
Jang et al.

(10) Patent No.: US 7,327,161 B2
(45) Date of Patent: Feb. 5, 2008

(54) SHIFT REGISTER

(75) Inventors: Yong Ho Jang, Gyeonggi-do (KR); Binn Kim, Seoul (KR); Soo Young Yoon, Gyeonggi-do (KR)

(73) Assignee: LG.Philips LCD Co., Ltd., Seoul (KR)

( * ) Notice: Subject to any disclaimer, the term of this patent is extended or adjusted under 35 U.S.C. 154(b) by 77 days.

(21) Appl. No.: 11/440,130

(22) Filed: May 25, 2006

(65) Prior Publication Data

US 2006/0269038 A1   Nov. 30, 2006

(30) Foreign Application Priority Data

May 26, 2005   (KR) ...................... 10-2005-0044378

(51) Int. Cl.
*H03K 19/173*   (2006.01)
(52) U.S. Cl. ........................... 326/46; 326/93; 327/200
(58) Field of Classification Search .................. 326/16, 326/46, 93; 327/199, 200
See application file for complete search history.

(56) References Cited

U.S. PATENT DOCUMENTS 5,719,504 A * 2/1998 Yamada ....................... 326/16
6,919,875 B2 * 7/2005 Abe et al. ................... 345/100
7,027,551 B2 * 4/2006 Han et al. ...................... 377/69

* cited by examiner

*Primary Examiner*—James H. Cho
(74) *Attorney, Agent, or Firm*—Morgan, Lewis & Bockius, LLP

(57) ABSTRACT

A shift register which is capable of performing bi-directional scanning is disclosed. The shift register includes first and second voltage input lines to which first and second voltages are input, respectively with the phases of the first and second voltages being opposite to each other; a plurality of stages dependently connected to a plurality of clock signal input lines which input a plurality of clock signals whose phases are sequentially delayed, wherein each stage includes: a scan direction controller to selectively output the first and second voltages thereto, according to first and second start pulses, and for controlling scan direction, a node controller to control voltages of first and second nodes according to a signal output from the scan direction controller, and an output unit to output a clock signal from one of the plurality of clock signal input lines thereto according to the voltage of each of the first and second nodes. The shift register can perform forward and reverse direction scans as first and second voltages whose phases are opposite to one another are selectively output thereto according to output signals from previous and next stages.

26 Claims, 14 Drawing Sheets

SHIFT REGISTER

This application claims the benefit of the Korean Patent Application No. 2005-0044378, filed on May 26, 2005, which is hereby incorporated by reference as if fully set forth herein.

BACKGROUND OF THE INVENTION

1. Field of the Invention

The present invention relates to a shift register, and more particularly, to a shift register which is capable of performing bi-directional scanning.

2. Discussion of the Related Art

Recently, various flat panel display devices have appeared on the market to overcome disadvantages of a cathode ray tube (CRT), such as weight, volume, etc. Such flat display devices include a liquid crystal display (LCD), a field emission display (FED), a plasma display panel (PDP), and a light emitting display (LED), etc.

A related art LCD displays images thereon as light transmitted to the liquid crystal layer is controlled using electric fields. Here, the LCD includes a LCD panel in which liquid crystal (LC) cells are aligned in matrix form and a drive circuit for driving the LCD panel. The LCD panel comprises gate lines and data lines crossing each other therein. Liquid crystal (LC) cells are defined by the crossed regions. More specifically, the LCD panel includes pixel electrodes and common electrodes to apply electric fields to the respective LC cells. The pixel electrodes are connected to the data lines via sources and drains of the thin film transistor (TFT) which function as switching elements, respectively. The gate of the TFT is connected to one of the gate lines. The TFT for an LCD panel uses amorphous silicon or polysilicon in the semiconductor layer. Amorphous LCD apparatus has advantages in that the amorphous silicon layer has relatively good uniformity and stable characteristics. On the other hand, the amorphous LCD apparatus has drawbacks in that it is difficult to enhance the pixel density since it has relatively small charge mobility. However, such a problem can be overcome by improving the circuitry of the LCD apparatus such that a driving circuit using amorphous silicon is embedded on an array substrate.

As shown in FIG. 1, the LCD apparatus of the related art includes an image display 12 for displaying images, an LCD panel 10 for providing gate pulses to the image display 12, in which the image display 12 forms a gate shift register 50 therein, a printed circuit board (PCB) 20 on which a control circuit and a power supply circuit are mounted, a plurality of tape carrier packages (TCP) 30 which are connected between the PCB 20 and the LCD panel 10, and a plurality of data integrated circuits (ICs) 40 for providing analog image signals to the image display 12, wherein the data ICs 40 are mounted on each TCP 30. The image display 12 displays images through LC cells which are formed in a matrix form. Each LC cell is a switching element connected to a node between a gate line GL and a data line DL. Each LC cell includes TFTs which are formed of polysilicon or amorphous silicon. The data line DL inputs analog image signals from the data IC 40. The gate line GL inputs the gate pulses from the gate shift register 50.

Each image TCP 30 is electrically connected between the PCB 20 and the LCD panel 10 in a tape automated bonding (TAB) fashion. The input pads of each TCP 30 are electrically connected to the PCB 20 and the output pads are electrically connected to the LCD panel 10. Control signals and data signals from the control circuit mounted on the PCB 20 is input to each data IC 40 through the input pads of the TCP 30. Then the data IC 40 converts the data signals to analog image signals, using the input control signal, and provides the analog image signals to the data line DL of the LCD panel 10 through the output pads of the TCP 30.

As shown in FIG. 2, the gate shift register 50 is directly formed at one side of the LCD panel 10. The gate shift register 50 includes a plurality of stages 511~51n whose output leads are connected to the gate lines GL, respectively. The plurality of stages 511~51n are connected to a start pulse input line to which a start pulse SP is provided, respectively, and connected to at least one of clock signal input lines to which clock signals CLK are provided, in which the clock signals are sequentially phase-delayed by one clock. For example, if two clock signals are provided to the clock signal input lines, the gate shift register 50 is referred to as a "two-phase shift register." Therefore, the respective stages 511~51n shift the start pulse by one clock using one of the clock signals, and then output one clock-shifted start pulse thereto. The output signals from the respective stages 511~51n of the gate shift register 50 are functioned as gate pulses GP, and, at the same time, the output signals from stages 511~51n-1 are provided to the next stage 512~51n, to function as a start pulse SP.

As mentioned above, the LCD apparatus of the related art provides analog image signals from the plurality of data ICs 40 to the data lines DL, and the gate pulses GP are synchronously and sequentially provided to the gate lines GL, using the gate shift register 50 installed in the LCD panel 10. Therefore, the image display 12 can display images thereon. Namely, the LCD apparatus of the related art is triggered by a single start pulse SP to transfer an output signal to a next stage, such that the gate pulses can be sequentially output to the gate lines GL. Therefore, the LCD apparatus can only output the output signals uni-directionally. In other words, it cannot perform bi-directional scanning.

SUMMARY OF THE INVENTION

Accordingly, the present invention is directed to a shift register that substantially obviates one or more problems due to limitations and disadvantages of the related art.

An object of the present invention is to provide a shift register which is capable of performing bi-directional scanning.

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, a shift register comprises: first and second voltage input lines to which first and second voltages are input, respectively with the phases of the first and second voltages being opposite to each other; a plurality of stages dependently connected to a plurality of clock signal input lines which input a plurality of clock signals whose phases are sequentially delayed, wherein each stage includes: a scan direction controller to selectively output the first and second voltages thereto, according to first and second start pulses, and for controlling scan direction, a node controller to control voltages of first and second nodes according to a signal output from the scan direction controller, and an output unit to output a clock signal from one of the plurality of clock signal input lines thereto according to the voltage of each of the first and second nodes.

In another aspect, a shift register comprises: first and second voltage input lines to which first and second voltages are input, respectively, such that the phases of the first and second voltages are opposite to each other; first and second drive voltage input lines to which first and second drive voltages are provided, respectively, in which phases of the first and second drive voltages are opposite to each other based on frame units; a plurality of stages which are dependently connected to a plurality of clock signal input lines, inputting a plurality of clock signals whose phases are sequentially delayed, wherein each stage includes: a scan direction controller to selectively output the first and second voltages thereto, according to first and second start pulses, and for controlling scan direction, a node controller to control a voltage of each of a first node to a third node according to a signal output from the scan direction controller, and an output unit to output a clock signal from one of the plurality of clock signal input lines thereto, according to the voltage of each of the first node to the third node.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings.

DETAILED DESCRIPTION OF THE PREFERRED EMBODIMENTS

Reference will now be made in detail to the preferred embodiments of the present invention, examples of which are illustrated in the accompanying drawings. Wherever possible, the same reference numbers will be used throughout the drawings to refer to the same or like parts.

Figure 1:
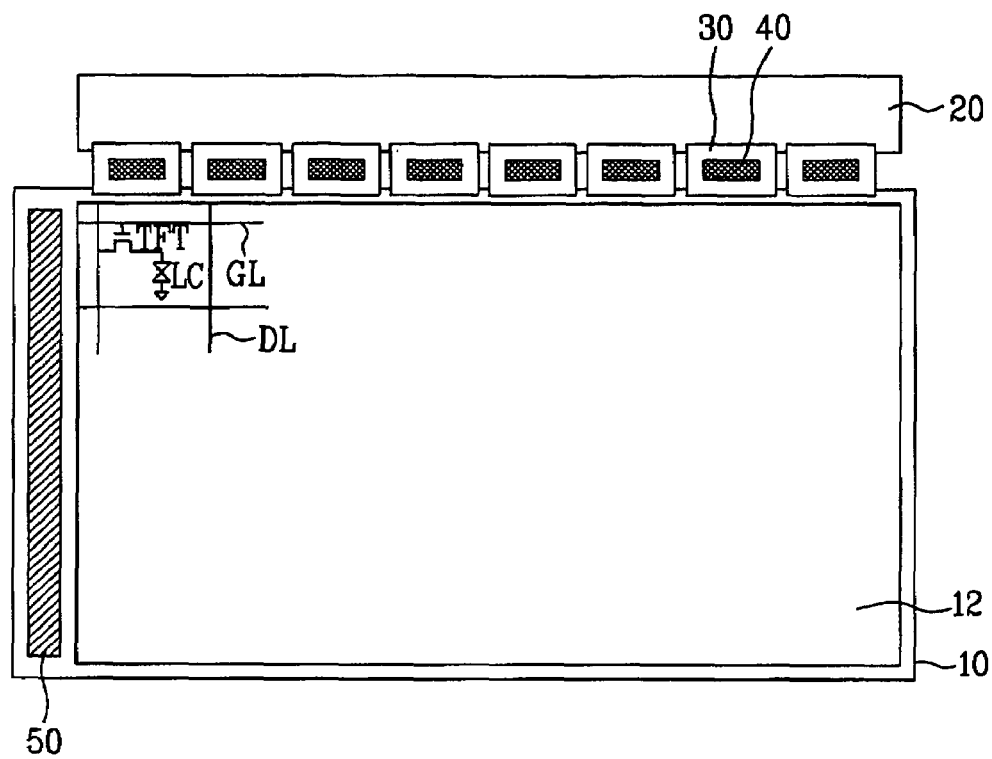
FIG. 1 illustrates a schematic liquid crystal display (LCD) device according to the related art.
Figure 2:
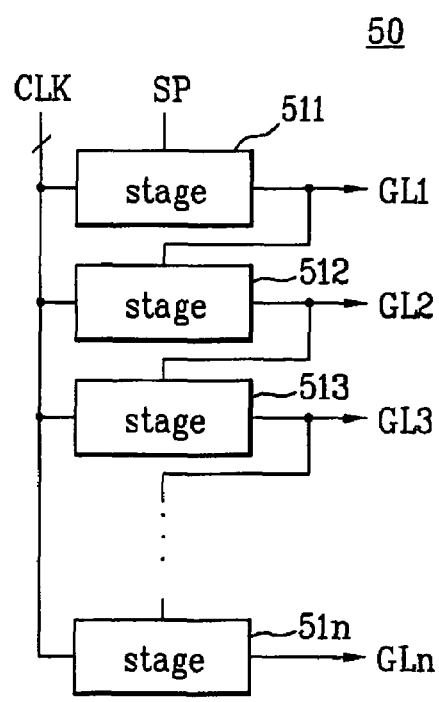
FIG. 2 illustrates a related art schematic shift register of FIG. 1.
Figure 3:
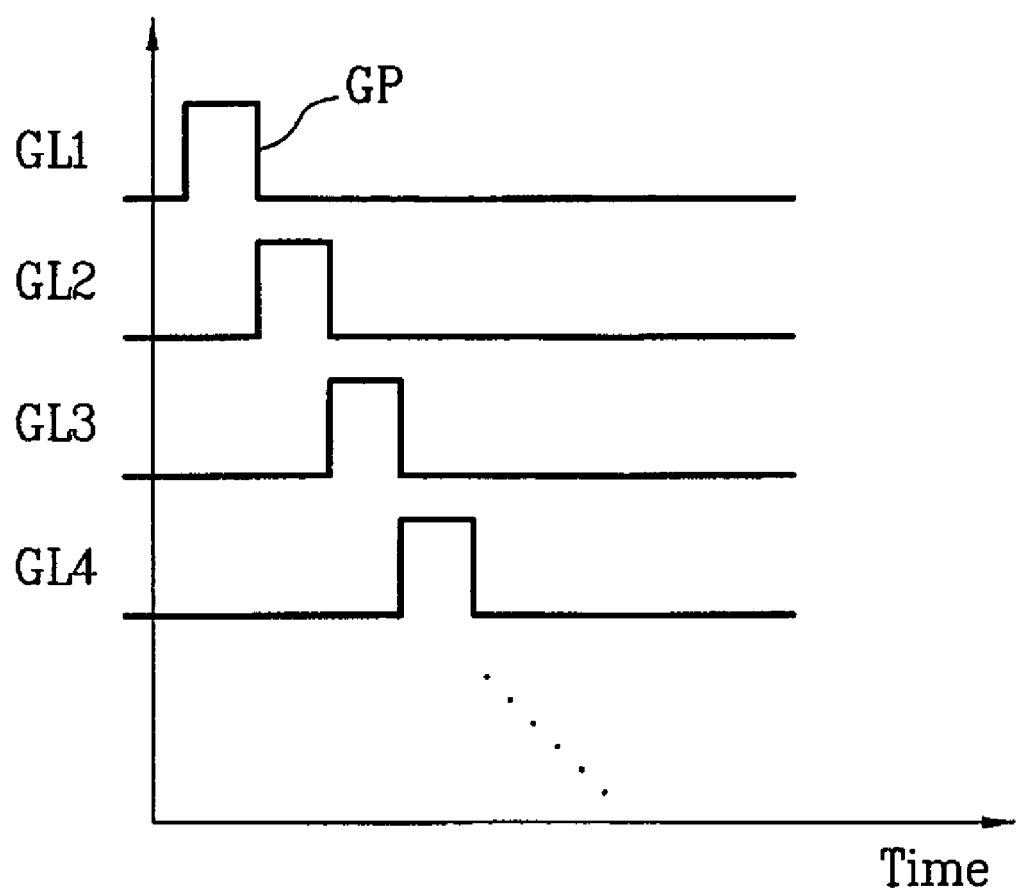
FIG. 3 illustrates waveforms when the shift register of FIG. 2 is operated according to the related art.
Figure 4:
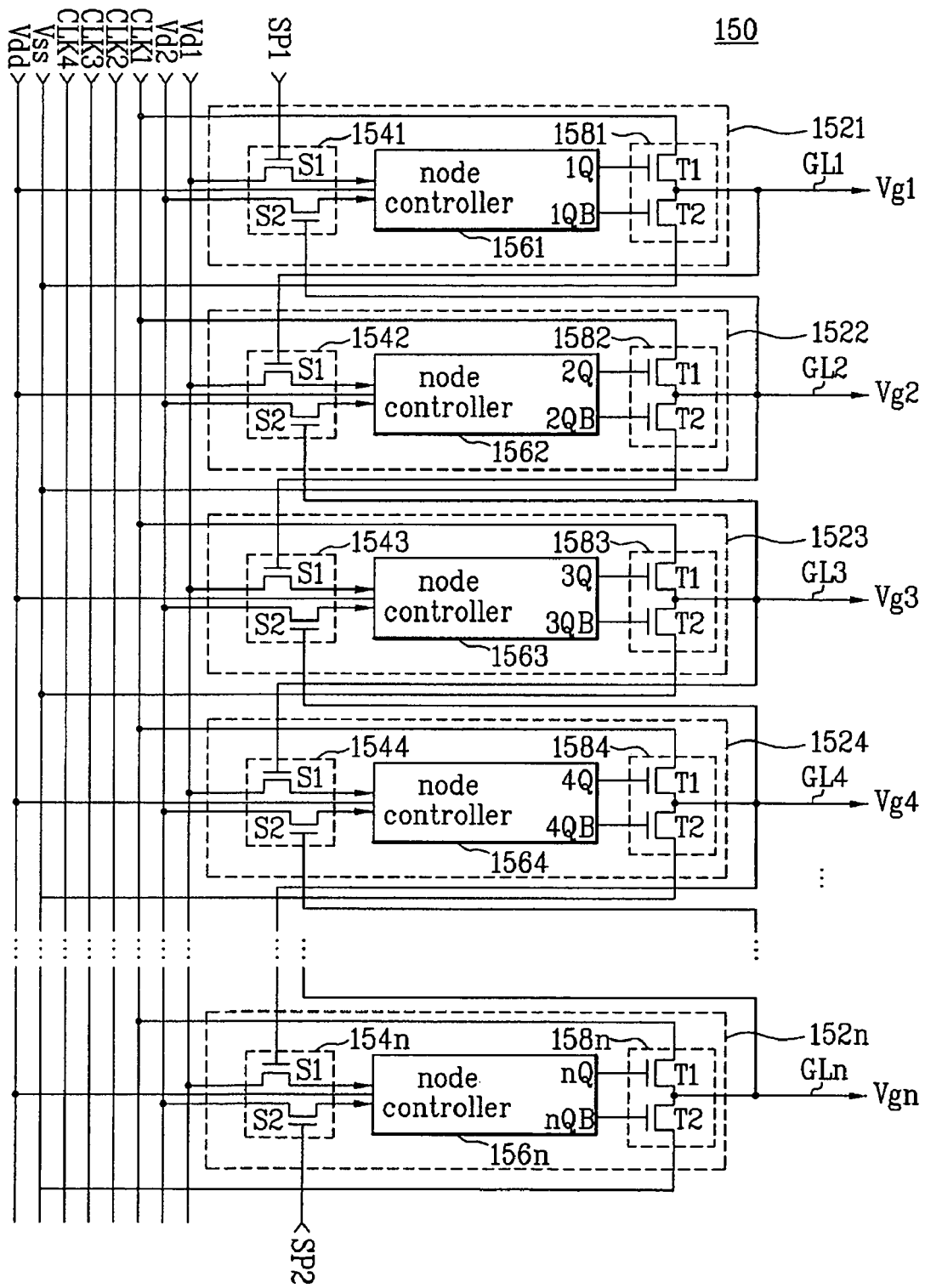
FIG. 4 illustrates a schematic block diagram of the shift register according to an exemplary embodiment of the present invention.

FIG. 4 illustrates an exemplary schematic block diagram of the shift register 150 according to an embodiment of the present invention. As shown in FIG. 4, the shift register 150 includes first and second voltage input lines to which first and second voltages Vd1 and Vd2 are provided, respectively, a drive voltage input line to which a drive voltage Vdd is provided, n stages 1521~152n which are dependently connected to a ground voltage input line to which a ground voltage Vss is provided, and a plurality of clock signal input lines to which clock signals CLK1~CLK4 are provided. Here, each of the stages 1521~152n includes scan direction controller 1541~154n for controlling scan directions using the first and second voltages Vd1 and Vd2, according to outputs signals (SP1 and Vg1~Vgn-1) output from previous stages and output signals (Vg2~Vgn and SP2) output from next stages, node controllers 1561~156n for controlling first and second nodes Q and QB according to the output signals from the scan direction controllers 1541~154n, and output units 1581~158n to output clock signals from the clock signal input line thereto, according to the voltage of each of the first and second nodes Q and QB. The first and second voltage input lines input the first and second voltages Vd1 and Vd2 whose phase are opposite to each other.

The drive voltage input line inputs a drive voltage having a voltage level to turn on a switch including a transistor and a switching element. This drive voltage is hereinafter referred to as a "high voltage." The ground voltage input line inputs a ground voltage Vss or a voltage having a voltage level, such that the ground voltage Vss and the low voltage can turn off a switch including a transistor and a switching element. This ground voltage is hereinafter referred to as a "low voltage." The plurality of clock signal input lines repeatedly input clock signals which are sequentially phase-delayed by one clock.

Each of the scan direction controller 1541~154n includes a first switching element S1 for providing the first voltage Vd1 from the first voltage input line to the node controller 1561~156n according to the output signal from the previous stage, in which the first switching element S1 is connected to the first voltage input line and the node controllers 1561~156n, and a second switching element S2 for providing the second voltage Vd2 from the second voltage input line to the node controller 1561~156n according to the output signal from the previous stage, in which the second switching element S2 is connected to the second voltage input line and the node controllers 1561~156n. Here, the first switching element S1 of the first scan direction controller 1541 is controlled by a first start pulse SP1 which is provided from an external side or a dummy stage to the first start pulse input line. The second switching element S2 of the scan direction controller 154n is controlled by a second start pulse SP2, which is provided from an external side or a dummy stage to the second start pulse input line. Here, the first and second start pulses SP1 and SP2 may be identical to or be different from each other.

Each of the node controllers 1561~156n controls the voltage of each of the first and second nodes Q and QB according to the first and second voltages Vd1 and Vd2, in which the first and second voltages Vd1 and Vd2 are input to each of the node controllers 1561~156n through the first and second switching elements S1 and S2 of the scan direction controller 1541~154n. Each of the output units 1581~158n outputs a clock signal CLK input from the clock signal input line to an output lead according to the voltages of the first and second node Q and QB of each of the node controllers 1561~156n. Namely, each of the output units 1581~158n outputs the clock signal CLK to an output lead according to the voltage of the first node Q, and discharges the voltage of the output lead according to the voltage of the second node QB. For this purpose, each of the output units 1581~158n includes a first switch T1 to output the clock signal CLK to the output lead according to the voltage of the first node Q, and a second switch T2 for providing the ground voltage Vss to the output lead according to the voltage of the second node QB. Here, if the number of clock signals is greater than 4, the output units are operated as follows. A first switch T1 of output units 158i+1 (i=4j, in which j is 0, 1, 2, . . . ) is dependently connected to a first clock input line to which a first clock signal CLK1 is provided, a first switch T1 of output units 158i+2 is dependently connected to a second clock input line to which a second clock signal CLK2 is provided, a first switch T1 of output units 158i+3 is dependently connected to a third clock input line to which a third clock signal CLK3 is provided, a first switch T1 of output units 158i+4 is dependently connected to a fourth clock input line to which a fourth clock signal CLK4 is provided. Therefore, when the number of clock signals is k, the first switch T1 of each of k output units is sequentially connected to k clock signal input lines.

As mentioned above, the shift register 150 of the present invention can perform forward or reverse direction scanning as the first and second start pulses SP1 and SP2, phase of the clock signal CLK, and first and second voltages Vd1 and Vd2 are controlled.

Figure 5:
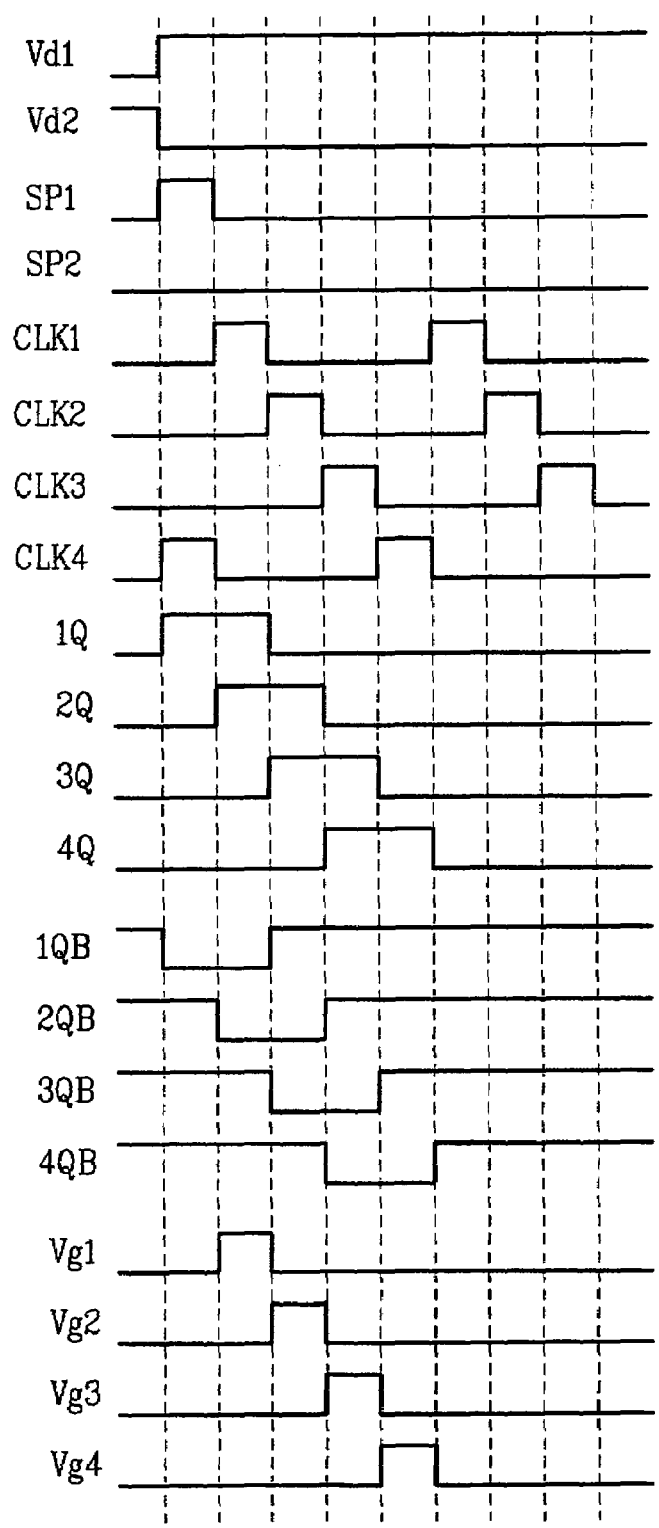
FIG. 5 illustrates exemplary waveforms when the shift register of FIG. 4 performs a forward direction scan operation.

FIG. 5 illustrates waveforms when the shift register of FIG. 4 performs a forward direction scan operation. As shown in FIG. 5 along with FIG. 4, a forward direction scan operation of the shift register will be described in detail as follows. Regarding the forward direction scan, the first voltage input line inputs a first voltage Vd1 of a high level, and the second voltage input line inputs a second voltage Vd2 of a low level.

First, a first stage 1521 of the n stages 1521~152n outputs a first output signal Vg1 of a high level thereto using a first start pulse SP1 of a high level which is output from the first start pulse input line, a second output voltage Vg2 of a low level from the second stage 1522, a first voltage Vd1 of a high level, and a first clock signal CLK1 of the first clock signal input line. More specifically, the first stage 1521 is operated as follows. Its first scan direction controller 1541 is operated such that a first switching element S1 can be turned on by the first start pulse SP1 of a high level. A, second switching element S2 is turned off by the second output signal Vg2 of a low level, which is output from the second stage 1522. Therefore, the first scan direction controller 1541 can provide the high first voltage Vd1 of the first voltage input line to the first node controller 1561 through the first switching element S1.

The first node controller 1561 provides the high first voltage Vd1, which is provided through the first switching element S1 of the first scan direction controller 1541, to the first node 1Q, and then connects the second node 1QB to the second drive voltage input line to which the ground voltage Vss is provided. Therefore, the first node 1Q is charged with the first voltage Vd1 of a high level, but the second node 1QB is discharged by the ground voltage Vss. Also, the first output unit 1581 is operated such that the first switch T1 is turned on by the high first voltage Vd1, which is charged at the first node 1Q of the first node controller 1561. The second switch T2 is turned off by the ground voltage Vss which is provided to the second node 1QB. Therefore, the first output unit 1581 can output the first clock signal CLK1 of a high level as a first output signal Vg1 through the first switch T1, in which the high first clock signal CLK1 is provided via the first clock signal input line. Here, the first output signal Vg1 is provided to the first gate line GL1 and the second scan direction controller 1542 of the second stage 1522.

After finishing operation of the first stage 1521, the second stage 1522 outputs a second output signal Vg2 of a high level using a first output signal Vg1 of a high level, which is output from the first stage 1521, a third output signal Vg3 of a low level, which is output from a third stage 1523, a first voltage Vd1 of a high level, and a second clock signal CLK2 of the second clock signal input line. More specifically, the second stage 1522 is operated as follows. The second scan direction controller 1542 is operated such that a first switching element S1 is turned on by the high output signal Vg1. A second switching element S2 is turned off by a third output signal Vg3 of a low level which is output from the third stage 1523. Therefore, the second scan direction controller 1542 can provide the high first voltage Vd1 of the first voltage input line to the second node controller 1562 through the first switching element S1. The second node controller 1562 provides the high first voltage Vd1 through the first switching element S1 of the second scan direction controller 1542 to the first node 2Q, and then connects the second node 2QB to the ground voltage input line to which the ground voltage Vss is provided. Therefore, the first node 2Q is charged with the first voltage Vd1 of a high level, but the second node 2QB is discharged by the ground voltage Vss.

Also, the second output unit 1582 is operated such that the first switch T1 is turned on by the first voltage Vd1 of a high level, which is charged at the first node 2Q of the second node controller 1562. The second switch T2 is turned off by the ground voltage Vss, which is provided to the second node 2QB. Therefore, the second output unit 1582 can output the second clock signal CLK2 of a high level as the second output signal Vg2, through the first switch T1, in which the high second clock signal CLK2 is provided via the second clock signal input line. Here, the second output signal Vg2 is provided to the second gate line GL2, and, at the same time, provided to the first scan direction controller 1541 of the first stage 1521 and the third scan direction controller 1543 of the third stage 1523.

On the other hand, while the high second output signal Vg2 is output from the second stage 1522, the first stage 1521 outputs a first output signal Vg1 of a low level, according to a first start pulse SP1 of a low level which is provided from the first start pulse input line, a second output signal Vg2 of a high level which is output from the second stage 1522, and a second voltage Vd2 of a low level. More specifically, the first stage 1521 is operated as follows. The first scan direction controller 1541 is operated such that the first switching element SI is turned off by the low first start pulse SP1. The second switching element S2 is turned off by the high second output signal Vg2 which is output from the second stage 1522. Therefore, the first scan direction controller 1541 can provide the low second voltage Vd2 of the second voltage input line to the first node controller 1561 through the second switching element S2. Also, the first node controller 1561 connects the first node 1Q to the ground voltage input line through the second switching element S2 of the first scan direction controller 1541 to provide the drive voltage Vdd of the drive voltage input line to the second node 1QB. Therefore, the first node 1Q is discharged by the low second voltage Vd2, but the second node 1QB is charged with the high drive voltage Vdd. In addition, the first output unit 1581 is operated such that the first switch T1 is turned off by the second voltage Vd2 of the first node 1Q of the first node controller 1561, but the second switch T2 is turned on by the drive voltage Vdd of a high level of the second node 1QB. Therefore, the first output unit 1581 can output the low first output signal Vg1 to the output lead as it inputs the ground voltage Vss through the second switch T2.

After finishing operation of the second stage 1522, a third stage 1523 outputs a third output signal Vg3 of a high level, using a second output signal Vg2 of a high level, which is output from the second stage 1522, a fourth output signal Vg4 of a low level, which is output from the fourth stage 1524, and a first voltage Vd1 of a high level, and a third clock signal CLK3 of the third clock signal input line. More specifically, the third stage 1523 is operated as follows. A third scan direction controller 1543 is operated such that a first switching element S1 is turned on by the high output signal Vg2. A second switching element S2 is turned off by a fourth output signal Vg4 of a low level which is output from a fourth stage 1524. Therefore, the third scan direction controller 1543 can provide the high first voltage Vd1 of the first voltage input line to the third node controller 1563 through the first switching element S1.

The third node controller 1563 provides the high first voltage Vd1 which is provided through the first switching element S1 of the third scan direction controller 1543 to the first node 3Q, and then connects the second node 3QB to the ground voltage input line. Therefore, the first node 3Q is charged with the high first voltage Vd1, but the second node 3QB is discharged by the ground voltage Vss. Also, the third output unit 1583 is operated such that the first switch T1 is turned on by the first voltage Vd1 of a high level which is charged at the first node 3Q of the third node controller 1563. The second switch T2 is turned off by the ground voltage of the second node 3QB. Therefore, the third output unit 1583 can output the third clock signal CLK3 of a high level as the third output signal Vg3, through the first switch T1, in which the high third clock signal CLK3 is provided via the third clock signal input line. Here, the third output signal Vg3 is provided to the third gate line GL3 and, at the same time, provided to the second scan direction controller 1542 of the second stage 1522 and fourth scan direction controller 1544 of the fourth stage 1524.

On the other hand, while the high third output signal Vg3 is output from the stage 1523, the second stage 1522 outputs a second output signal Vg2 of a low level, according to a first output signal Vg1 of a low level which is provided from the third stage 1523, a third output signal Vg3 of a high level output from the third stage 1523, and a second voltage Vd2 of a low level. More specifically, the second stage 1522 is operated as follows. A second scan direction controller 1542 is operated such that the first switching element S1 is turned off by the low first output signal Vg1. The second switching element S2 is turned on by the high third output signal Vg3 which is output from the third stage 1523. Therefore, the second scan direction controller 1542 can provide the low second voltage Vd2 of the second voltage input line to the second node controller 1562 through the second switching element S2. Also, the second node controller 1562 connects the first node 2Q to the ground voltage input line through the second switching element S2 of the second scan direction controller 1542 to provide the drive voltage Vdd of the drive voltage input line to the second node 2QB. Therefore, the first node 2Q is discharged by the low second voltage Vd2, but the second node 2QB is charged with the high drive voltage Vdd. In addition, the second output unit 1582 is operated such that the first switch T1 is turned off by the second voltage Vd2 of the first node 2Q of the second node controller 1562, but the second switch T2 is turned on by the drive voltage Vdd of the second node 2QB. Therefore, the second output unit 1582 can output the low output signal Vg2 to the output lead, as it inputs the ground voltage Vss through the second switch T2.

After finishing operation of the third stage 1523, a fourth stage 1524 outputs a fourth output signal Vg4 of a high level, using a third output signal Vg3 of a high level, which is output from the third stage 1523, a fifth output signal Vg5 of a low level, which is output from a fifth stage 1525, a first voltage Vd1 of a high level, and a fourth clock signal CLK4 of the fourth clock signal input line. The fourth stage 1524 outputs the fourth output signal Vg4 of a high level thereto, and since it is operated in a similar manner to the second and third stages 1522 and 1523, a detailed description thereof will be omitted. Also, since each of stages 1542~154n outputs a high output signal. Since it is operated in a similar manner to the second and third stages 1522 and 1523, a detailed description thereof will be omitted.

As such, the shift register 150 according to the present invention can perform forward direction scan using the first start pulse SP1, the first clock signal CLK1~the fourth clock signal CLK4, the first and second voltages Vd1 and Vd2, and the output signals from previous and next stages. Through these scans, gate pulses can be sequentially provided to first gate line GL1 through the n-th gate line GLn.

Figure 6:
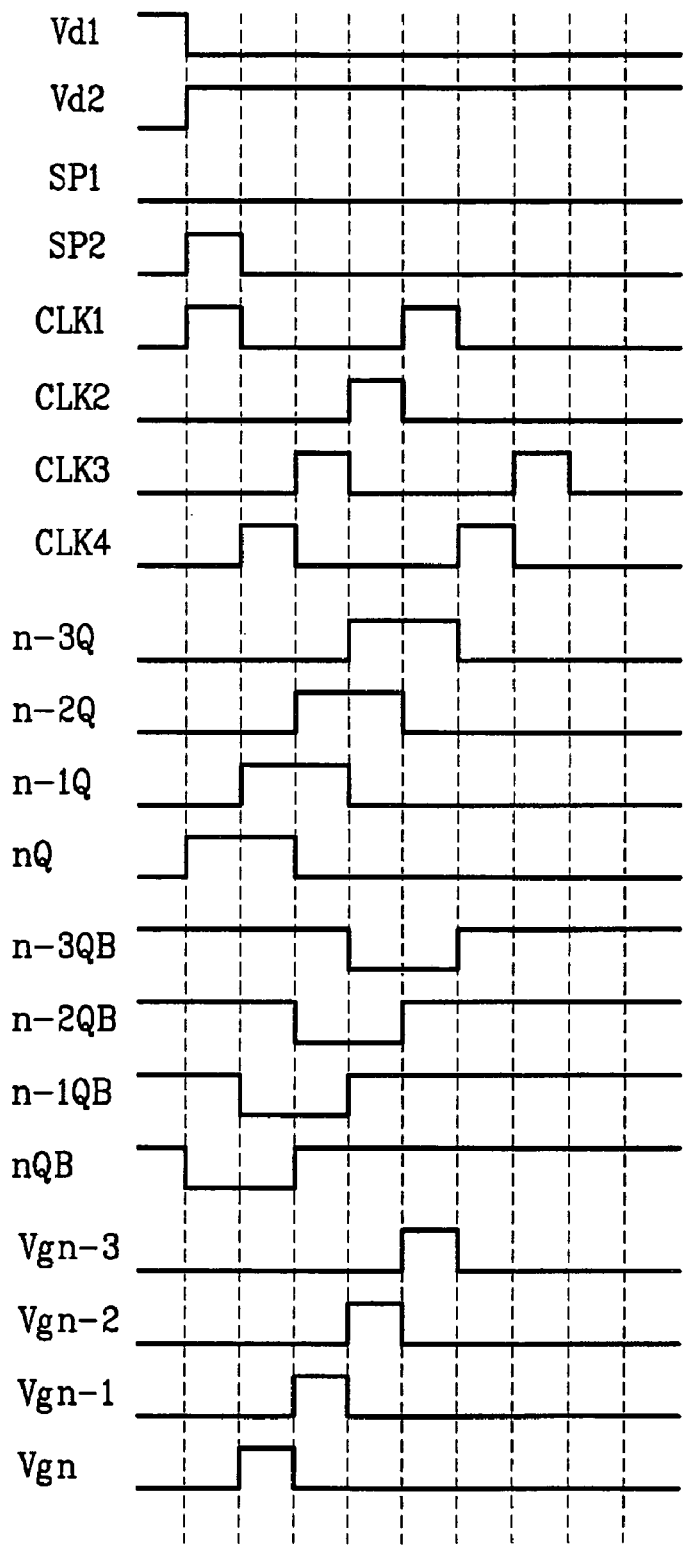
FIG. 6 illustrates exemplary waveforms when the shift register of FIG. 4 performs a reverse direction scan operation.

FIG. 6 illustrates exemplary waveforms when the shift register of FIG. 4 performs a reverse direction scan operation. As shown in FIG. 6 along with FIG. 4, a reverse direction scan operation of the shift register will be described in detail as follows. Regarding reverse direction scan, the first voltage input line inputs a first voltage Vd1 of a low level, and the second voltage input line inputs a second voltage Vd2 of a high level.

First, the n-th stage 152n of the n stages 1521~152n outputs n-th output signal Vgn of a high level using a second start pulse SP2 of a high level, which is output from the second start pulse input line, an n-1 output signal Vgn-1 of a low level output from the n-1-th stage 152n-1, a second voltage Vd2, and a fourth clock signal CLK4 of the fourth clock signal input line. More specifically, the n-th stage 152n is operated as follows. The n-th scan direction controller 154n is operated such that a second switching element S2 is turned on by a second start pulse SP1 of a high level. A first switching element S1 is turned off by n-1-th output signal Vgn-1 of a low level, which is output from the n-1-th stage 152n-1. Therefore, the n-th scan direction controller 154n can provide the high second voltage Vd2 of the second voltage input line to the n-th node controller 156n through the second switching element S2.

The n-th node controller 156n provides the high second voltage Vd2, which is provided through the second switching element S2 of the n-th scan direction controller 154n, to the first node nQ, and then connects the second node nQB to the ground voltage input line to which the ground voltage Vss is provided. Therefore, the first node nQ is charged with the high second voltage Vd2, but the second node nQB is discharged by the ground voltage Vss. Also, the n-th output unit 158n is operated such that the first switch T1 is turned on by the high second voltage Vd2, which is charged at the first node nQ of the n-th node controller 156n. A second switch T2 is turned off by the ground voltage Vss of the second node nQB. Therefore, the n-th output unit 158n can output the fourth clock signal CLK4 of a high level as the n-th output signal Vgn through the first switch T1, in which the high fourth clock signal CLK4 is provided via the fourth clock signal input line. Here, the n-th output signal Vgn is provided to the n-th gate line GLn and the n-1-th scan direction controller 154n-1 of the n-1-th stage 152n-1.

After finishing operation of the n-th stage 152n, the n-1-th stage 152n-1 outputs the n-1-output signal Vgn-1 of a high level, using an n-th output signal Vgn of a high level, which is output from the n-th stage 152n, the n-2-th output signal Vgn-2 of a low level, which is output from the n-2-th stage 152n-2, a second voltage Vd2 of a high level, and a third clock signal CLK3 of the third clock signal input line. More specifically, the n-1-th stage 152n-1 is operated as follows. The n-1-th scan direction controller 154n-1 is operated such that a second switching element S2 is turned on by the n-th output signal Vgn of a high level. And the first switching element S1 is turned off by the n-2 output signal Vgn-2 of a low level which is output from the n-2-th stage 152n-2. Therefore, the n-1 scan direction controller 154n-1 can provide the second voltage Vd2 of the second voltage input line to the n-1 node controller 156n-1 through the second switching element S2.

The n-1 node controller 156n-1 provides the high second voltage Vd2 through the second switching element S2 of the n-1-th scan direction controller 154n-1 to the first node n-1Q, and then connects the second node n-1QB to the ground voltage input line. Therefore, the first node n-1Q is charged with the second voltage Vd2 of a high level, but the second node n-1QB is discharged by the ground voltage Vss. Also, the n-1-th output unit 158n-1 is operated such that the first switch T1 is turned on by the second voltage Vd2 of a high level, which is charged at the n-1-th node n-1Q of the n-1-th node controller 156n-1. The second switch T2 is turned off by the ground voltage Vss, which is provided to the second node n-1QB. Therefore, the n-1-th output unit 158n-1 can output the third clock signal CLK3 of a high level as the n-1-th output signal Vgn-1, through the first switch T1, in which the high third clock signal CLK3 is provided via the third clock signal input line. Here, the n-1 output signal Vgn-1 is provided to the n-1-th gate line GLn-1, and, at the same time, provided to the n-2-th scan direction controller 154n-2 of the n-2-th stage 152n-2 and the n-th scan direction controller 154n of the n-th stage 152n.

On the other hand, while the high n-1 output signal Vgn-1 is output from the n-1-th stage 152n-1, the n-th stage 152n outputs the n-th output signal Vgn of a low level, according to the second start pulse SP2 of a low level, which is provided from the second start pulse input line, an n-1-th output signal Vgn-1 of a high level, which is output from the n-1-th stage 152n-1, and a first voltage Vd1 of a low level. More specifically, the first stage 152n is operated as follows. The n-th scan direction controller 154n is operated such that the second switching element S2 is turned on by the low second start pulse SP2. And the first switching element S1 is turned on by the high n-1-th output signal Vgn-1 which is output from the n-1-th stage 152n-1. Therefore, the n-th scan direction controller 154n can provide the low first voltage Vd1 of the first voltage input line to the n-th node controller 156n through the first switching element S1. Also, the n-th node controller 156n connects the first node nQ to the drive voltage input line through the first switching element S1 of the n-th scan direction controller 154n to provide the drive voltage Vdd of the drive voltage input line to the second node nQB. Therefore, the first node nQ is discharged by the first voltage Vd1 of a low level, but the second node nQB is charged with the drive voltage Vdd of a high level. In addition, the n-th output unit 158n is operated such that the first switch T1 is turned off by the first voltage Vd1 of the first node nQ of the n-th node controller 156n, but the second switch T2 is turned on by the drive voltage Vdd of a high level of the second node nQB. Therefore, the n-th output unit 158n can output the low n-th output signal Vgn to the output lead, as it inputs the ground voltage Vss though the second switch T2.

After finishing operation of the n-1-th stage 152n-1, an n-2-th stage 152n-2 outputs an n-2-th output signal Vgn-2 of a high level, using an n-1-th output signal Vgn-1 of a high level, which is output from the n-1-th stage 152n-1, an n-3-th output signal Vgn-3 of a low level, which is output from the n-3-th stage 152n-3, a second voltage Vd2 of a high level, and a the second clock signal CLK2 of the second clock signal input line. More specifically, the n-2-th stage 152n-2 is operated as follows. The n-2-th scan direction controller 154n-2 is operated such that a second switching element S2 is turned on by the high n-1 output signal Vbn-1. A first switching element S1 is turned off by an n-3-th output signal Vgn-3 of a low level. Therefore, the n-2-th scan direction controller 154n-2 provides the high second voltage Vd2 of the second voltage input line to the n-2-th node controller 156n-2 through the second switching element S2. The n-2-th node controller 156n-2 provides the high second voltage Vd2, which is provided through the second switching element S2 of the n-2-th scan direction controller 154n-2, to the first node n-2Q, and then connects the n-2QB to the ground voltage input line. Therefore, the first node n-2Q is charged with the second voltage Vd2 of a high level, but the second node n-2QB is discharged by the ground voltage Vss. Also, the n-2-th output unit 158n-2 is operated such that the first switch T1 is turned on by the second voltage Vd2 of a high level, which is charged at the first node n-2Q of the n-2-th node controller 156n-2. And the second switch T2 is turned off by the ground voltage Vss of the second node n-2QB. Therefore, the n-2-th output unit 158n-2 can output the second clock signal CLK2 as an n-2-th output signal Vgn-2, through the first switch T1, in which the high second clock signal CLK2 is provided via the second clock signal input line. Here, the n-2-th output signal Vgn-2 is provided to the n-2-th gate line GLn-2, and, at the same time, provided to the n-3-th scan direction controller 154n-3 of the n-3-th stage 152n-3, and the n-1-th scan direction controller 154n-1 of the n-1-th stage 152n-1.

On the other hand, while the n-2-th output signal Vgn-2 is output from the n-2-th stage 152n-2, the n-1-th stage 152n-1 outputs a output signal Vgn-1 of a low level, according to an output signal Vgn of a low level, which is provided from the stage 152n, a output signal Vgn-2 of a high level, which is output from the stage 152n-2, and a first voltage Vd1 of a low level. More specifically, the stage 152n-1 is operated as follows. A scan direction controller 154n-1 is operated such that a second switching element S2 is turned off by the low n-th output signal Vgn. The first switching element S1 is turned on by a high n-2 output signal Vgn-2 which is output from the n-2-th stage 152n-2. Therefore, the n-1-th scan direction controller 154n-1 can provide the low first voltage Vd1 of the first voltage input line to the n-1 node controller 156n-1 though the first switching element S1. Also, the n-1-th node controller 156n-1 connects the first node n-1Q to a drive voltage input line through the first switching element S1 of the n-1-th scan direction controller 154n-1 to provide the drive voltage of the drive voltage input line to the second node n-1QB. Therefore, the first node n-1Q is discharged by the first voltage Vd1 of a low level, but the second node n-1QB is charged with the high drive voltage. In addition, the n-1-th output unit 158n-1 is operated such that the first switch T1 is turned off by the first voltage of the first node n-1Q of the n-1-th node controller 156n-1, but the second switch T2 is turned on by the drive voltage Vdd of the second node n-1QB. Therefore, the n-1-th output unit 158n-1 can output the n-1-th output signal Vgn-1 of a low level to the output lead as it inputs the ground voltage through the second switch T2.

After finishing operation of the n-2-th stage 152n-2, an n-3 stage 152n-3 outputs an n-3 output signal Vgn-3 of a high level, using an n-2-th output signal Vgn-2 of a high level, which is output from the n-2-th stage 152n-2, an n-4-th output signal Vgn-4 of a low level, which is output from the n-4-th stage 152n-4, a second voltage Vd2 of a high level, and a first clock signal CLK1 of the first clock signal input line. The n-3-th stage 152n-3 outputs the n-3-th output signal Vgn-3 of a high level thereto, since it is operated in a similar manner to the n-1-th and n-2-th stages 152n-1 and 152n-2, a detailed description thereof will be omitted. Also, each of stages 154n-4 ~154l outputs an n-3-th output signal Vgn-3 of a high level. Since this is operated in a similar manner to the n-1-th and n-2-th stages 152n-1 and 152n-2, a detailed description thereof will be omitted. As such, the shift register 150 according to the present invention can perform reverse direction scan using the second start pulse SP2, the first clock signal CLK1~the fourth clock signal CLK4, the first and second voltages Vd1 and Vd2, and output signals from previous and next stages. Through this scan, the gate pulses can be sequentially provided to the n-th gate line GLn through the first gate line GL1.

Figure 7:
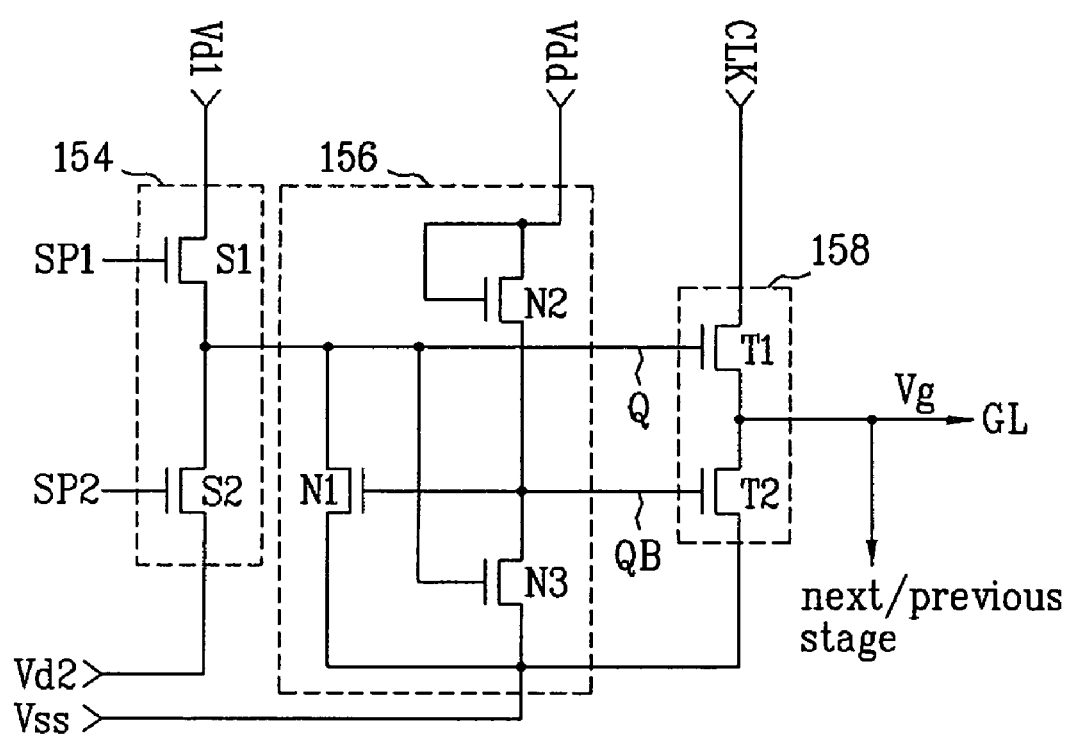
FIG. 7 illustrates a circuit of one of a plurality of stages included in the shift register according to a first exemplary embodiment of the present invention.

FIG. 7 illustrates an exemplary circuit of one of a plurality of stages included in a shift register according to the first embodiment of the present invention. As shown in FIG. 7, the stage of the shift register includes first and second voltage input lines to which first and second voltages Vd1 and Vd2 are provided, respectively, a drive voltage input line to which a drive voltage Vdd is provided, a ground voltage input line to which a ground voltage Vss is provided, first and second start pulse input lines to which first and second start pulses SP1 and SP2 are provided, respectively, a clock signal input line to which a clock signal is provided, a scan direction controller 154, a node controller 156, and an output unit 158. The first and second voltage input lines input first and second voltages Vd1 and Vd2 from an external side according to the scan directions, in which phases of the first and second voltages are opposite to one another. Also, the drive and ground voltage input lines input the drive and ground voltages Vdd and Vss, whose phase are opposite to one another, from an external side, according to scan directions, respectively. Also, the first and second start pulse input lines input first and second start pulses SP1 and SP2 according to scan directions. Here, the first start pulse input line inputs an output signal from an external side or the previous stage, and the second start pulse input line inputs an output signal from an external side or the next stage.

The scan direction controller 154 includes a first switching element S1 for providing a first voltage Vd1 to a first node Q according to a first start pulse SP1, in which the first switching element S1 is connected between the first voltage input line and the first node Q of the node controller 156. A second switching element S2 for providing a second voltage Vd2 to the first node Q according to a second start pulse SP2, in which the second switching element S2 is connected between the second voltage input line and the node controller 156. The first switching element S1 is turned on by the first start pulse SP1 of a high level in order to provide the first voltage Vd1 to the first node Q. The second switching element S2 is turned on by the second start pulse SP2 of a high level in order to provide the second voltage Vd2 to the first node Q.

The node controller 156 includes first to third transistors N1~N3 to control the voltage of each of the first and second nodes Q and QB, according to the voltage of the first node Q. The first transistor N1 is connected between the first node Q and the ground voltage input line to provide the ground voltage Vss to the first node Q according to the voltage of the second node QB, thereby discharging the voltage of the first node Q. The second transistor N2 forming a diode circuit is connected between the drive input line and the second node QB to charge the second node QB with the drive voltage Vdd. The third transistor N3 is connected between the second node QB and the ground voltage input line to provide the ground voltage to the second node QB according to the voltage of the first node, thereby discharging the voltage of the second node QB.

The output unit 158 includes a first switch T1 to output the clock signal CLK to the output lead according to the voltage of the first node Q of the node controller 156, and a second switch T2 to output the ground voltage Vss to the output lead according to the voltage of the second node QB of the node controller 156. The first switch T1 is connected between the clock signal input line and the output lead to output the clock signal CLK to the output lead when the voltage of the first node Q is high. The second switch T2 is connected between the ground voltage input line and the output lead to provide the ground voltage Vss to the output lead when the voltage of the second node QB is high, thereby discharging the voltage of the output lead.

Figure 8:
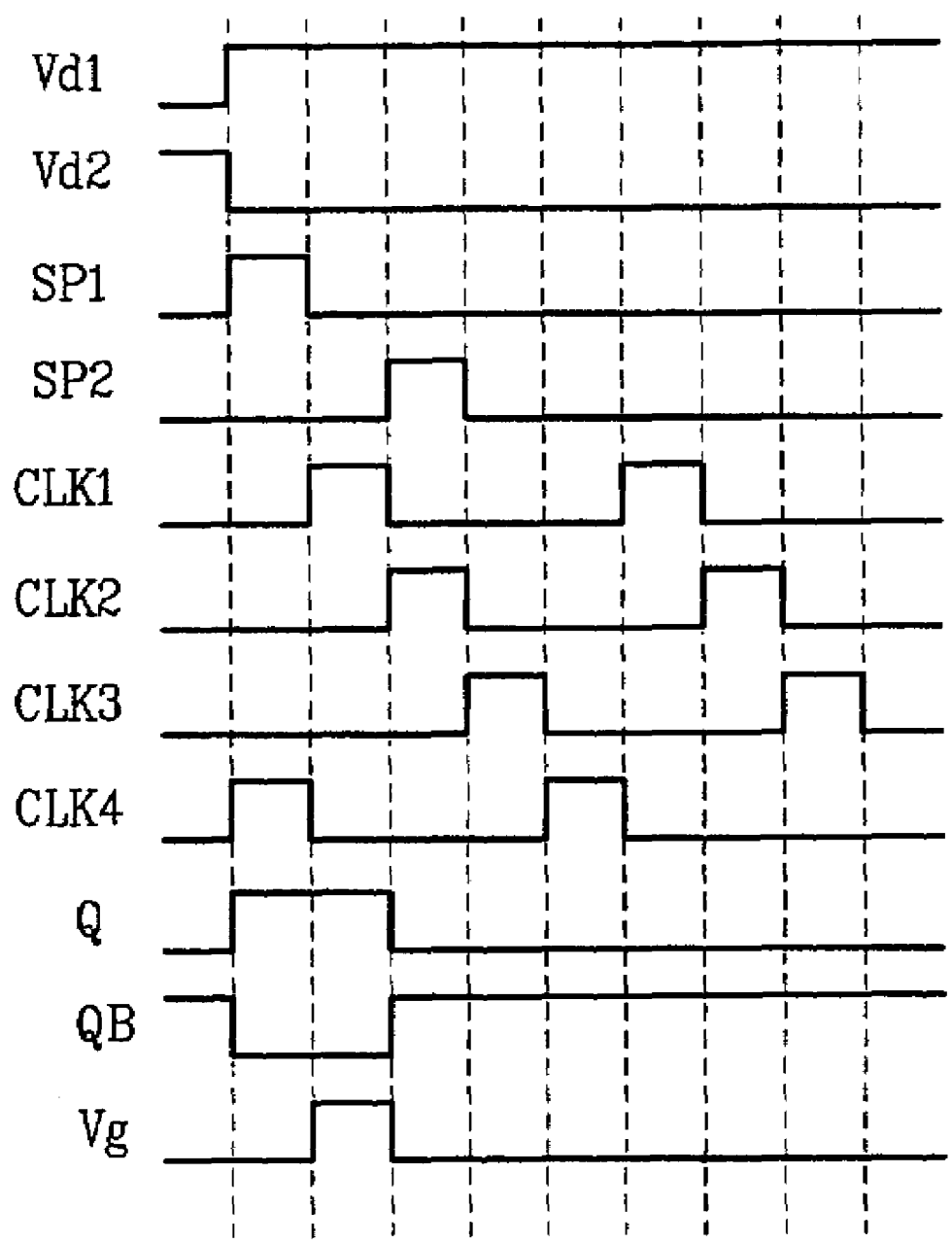
FIG. 8 illustrates exemplary waveforms when the stage of FIG. 7 is operated in forward direction.

FIG. 8 illustrates exemplary waveforms when the stage of FIG. 7 is operated in forward direction. As shown in FIG. 8 along with FIG. 7, a forward direction scan operation of the shift register will be described in detail as follows. Regarding forward direction scan, the first voltage input line inputs a first voltage Vd1 of a high level from an external side or a previous stage, and the second voltage input line inputs a second voltage Vd1 of a low level from an external side or a next stage. Also, the first start pulse input line inputs a first start pulse SP1 of a high level and the second start pulse input line inputs a second start pulse SP2 of a low level.

First, the scan direction controller 154 is operated such that the first switching element S1 is turned on according to the first start pulse SP1 of a high level, and the second switching element S2 is turned off according to the second start pulse SP2 of a low level. Therefore, the scan direction controller 154 can provide the first voltage Vd1 of a high level to the first node Q of the node controller 156 through the first switching element S1. Next, the node controller 156 is operated such that the first node Q is charged with the first voltage Vd1 of a high level provided from the scan direction controller 154 to turn on the third transistor N3. Therefore, the ground voltage Vss can be provided to the second node QB through the third transistor N3. Afterwards, the output unit 158 is operated such that the first switch T1 is turned on by the first voltage Vd1 of a high level, which is charged at the first node Q by the node controller 156, but the second switch, T2 is turned off by the ground voltage of the second node QB. Therefore, the output unit 158 outputs a clock signal CLK of a high level as an output signal Vg to the output lead through the first switch T1.

After the high output signal Vg is output from the output unit of the stage, the stage inputs a first start pulse SP1 of a low level and a second start pulse SP2 of a high level. Therefore, the scan direction controller 154 is operated such that the first switching element S1 is turned off according to the first start pulse SP1 of a low level, and the second switching element S2 is turned on according to the second start pulse SP2 of a high level. Therefore, the scan direction controller 154 can provide the second voltage Vd2 of a low level to the first node Q of the node controller 156 through the second switching element S2.

Afterwards, the node controller 156 is operated such that the third transistor N3 is turned off as the second voltage Vd2 of a low level of the scan direction controller 154 is provided to the first node Q. Also, the first transistor N1 is turned on as the second node QB is charged with a drive voltage Vdd of a high level through the second transistor N2. And the first transistor N1 provides the ground voltage Vss to the first node Q, thereby discharging the voltage of the first node Q.

Next, the output unit 158 is operated such that the second switch T2 is turned on by the drive voltage Vdd, which is provided to the second node QB by the node controller 156. The first switch T1 is turned off by the ground voltage Vss of the first node Q. Therefore, the output unit 158 can output the output signal Vg of a low level according to the ground voltage Vss which is provided to the second switch T2.

Figure 9:
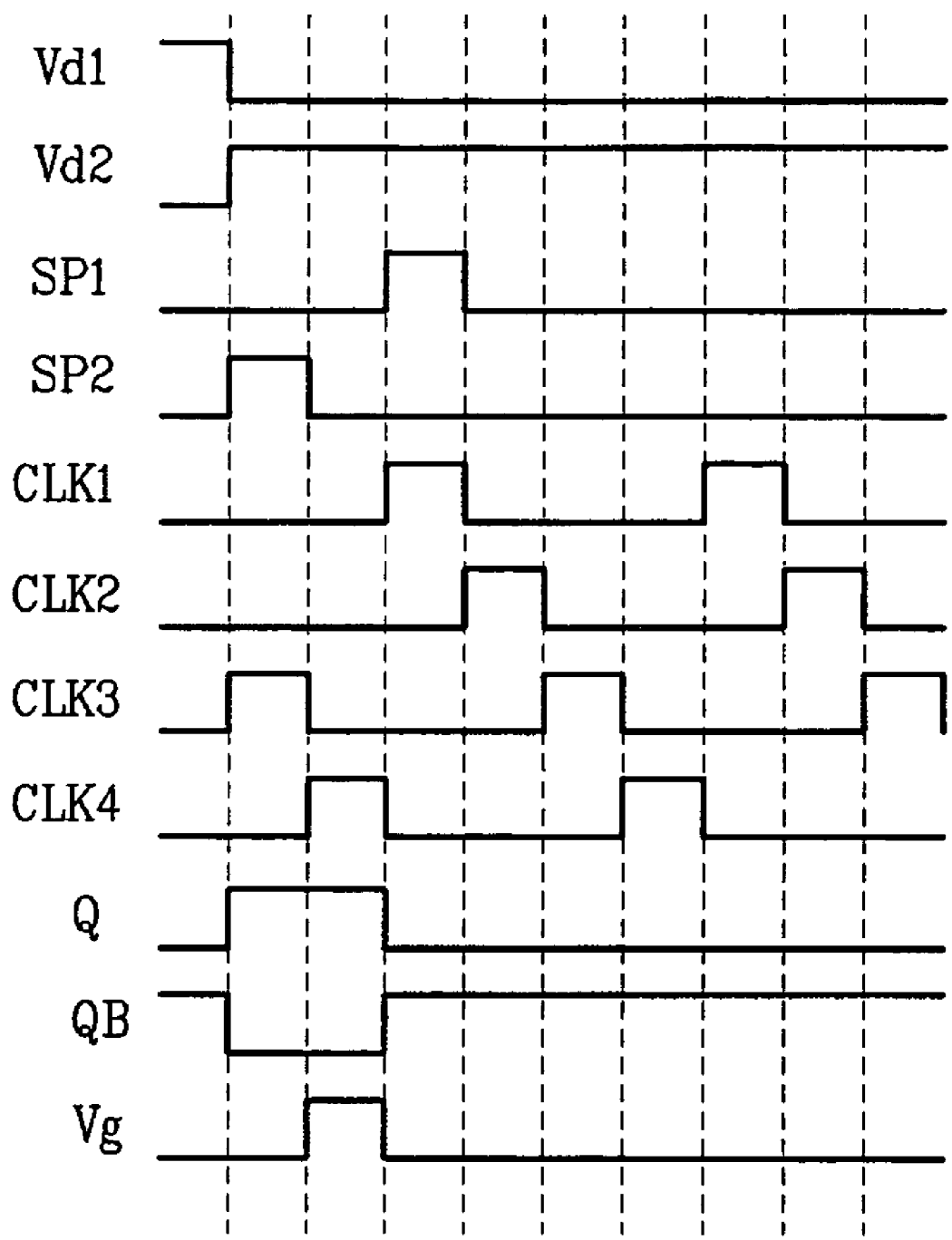
FIG. 9 illustrates waveforms when the stage of FIG. 7 is operated in reverse direction.

FIG. 9 illustrates exemplary waveforms when the stage of FIG. 7 is operated in reverse direction. As shown in FIG. 9 along with FIG. 7, a reverse direction scan operation of the shift register will be described in detail as follows. Regarding reverse direction scan, the first voltage input line inputs a first voltage Vd1 of a low level from an external side or a previous stage, and the second voltage input line inputs a second voltage Vd2 of a high level from an external side or a next stage. Also, the first start pulse input line inputs a first start pulse SP1 of a low level and the second start pulse SP2 inputs a second start pulse of a high level.

First, the scan direction controller 154 is operated such that the first switching element S1 is turned off according to the first start pulse SP1 of a low level, and the second switching element S2 is turned on according to the second start pulse SP2 of a high level. Therefore, the scan direction controller 154 can provide the second voltage Vd2 of a high level to the first node Q of the node controller 156 through the second switching element S2. Next, the node controller 156 is operated such that the first node Q is charged with the second voltage Vd2 of a high level from the scan direction controller 154 to turn on the third transistor N3. Therefore, the ground voltage Vss can be provided to the second node QB through the third transistor N3. Afterwards, the output unit 158 is operated such that the first switch T1 is turned on by the second voltage Vd2 of a high level, which is charged at the first node Q by the node controller 156, but the second switch, T2 is turned off by the ground voltage of the second node QB. Therefore, the output unit 158 can output a clock signal CLK of a high level as an output signal Vg to the output lead through the first switch T1.

After the high output signal Vg is output from the output unit of the stage, the stage inputs a first start pulse SP1 of a high level and a second start pulse SP2 of a low level. Therefore, the scan direction controller 154 is operated such that the first switching element S1 is turned on according to the first start pulse SP1 of a high level, and the second switching element SP2 is turn off according to the second start pulse SP2 of a low level. Therefore, the scan direction controller 154 can provide the first voltage Vd1 of a low level to the first node Q of the node controller 156 through the first switching element S1.

Afterwards, the node controller 156 is operated such that the third transistor N3 is turned off as the first voltage Vd1 of a low level of the scan direction controller 154 is provided to the first node Q. Also, the first transistor N1 is turned on as the second node QB is charged with the drive voltage Vdd of a high level through the second transistor N2. Thus, the first transistor N1 provides the ground voltage Vss to the first node Q, thereby discharging the voltage of the first node Q. After that, the output unit 158 is operated such that the second switch T2 is turned on by the drive voltage provided to the second node QB by the node controller 156. And the first switch T1 is turned off by the ground voltage Vss of the first node Q. Therefore, the output unit 158 can output an output signal Vg of a low level according to the ground voltage Vss which is provided to the second switch T2.

Figure 10:
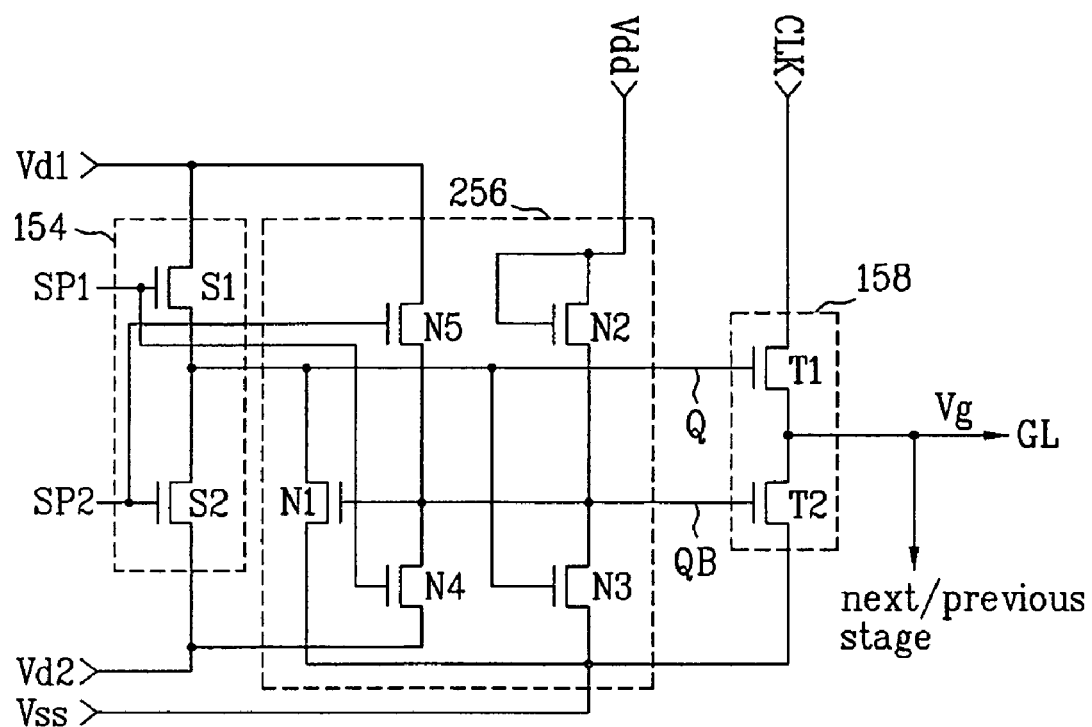
FIG. 10 illustrates a circuit of one of the plurality of stages included in the shift register according to a second embodiment of the present invention.

FIG. 10 illustrates an exemplary circuit of one of a plurality of stages included in a shift register according to a second embodiment of the present invention. As shown in FIG. 10, the stage of the shift register includes first and second voltage input lines to which first and second voltages Vd1 and Vd2 are provided, respectively, a drive voltage input line to which a drive voltage Vdd is provided, a ground voltage input line to which a ground voltage Vss is provided, first and second start pulse input lines to which first and second start pulses SP1 and SP2 are provided, respectively, a clock signal input line to which a clock signal CLK is provided, a scan direction controller 154, a node controller 256, and an output unit 158. Since the circuit elements of the stage of the shift register according to the second embodiment of the present invention are the same as those of the first embodiment of the present invention of FIG. 7, except for the node controller 256, descriptions for the same circuit elements will be omitted.

The node controller 256 included in the second exemplary embodiment of the present invention includes first to fifth transistors N1~N5 controlling the voltages of the first and second nodes Q and QB according to the voltage of the first node Q. The first transistor N1 is connected between the first node Q and the ground voltage input line to provide the ground voltage Vss to the first node Q according to the voltage of the second node QB, thereby discharging the voltage of the first node Q. The second transistor N2 forming a diode circuit is connected between the drive voltage input line and the second node QB to charge the second node QB with the drive voltage Vdd. The third transistor N3 is connected between the second node QB and the ground voltage input line to provide the ground voltage Vss to the second node QB according to the voltage of the first node Q, thereby discharging the voltage of the second node QB. The fourth transistor N4 is connected between the second node QB and the second voltage input line to provide the second voltage Vd2 to the second node QB according to the first start pulse SP1. The fifth transistor N5 is connected to the second node QB and the first voltage input line to provide the first voltage Vd1 to the second node QB according to the second start pulse SP2. As described above, since the first and second exemplary embodiments of the present invention are generally the same as each other except for the node controller 256 of the second embodiment, only operations of the node controller 256 will be described. Namely, the node controller 256 discharges the voltage of the second node QB by the first and second voltages Vd1 and Vd2, through the fourth and fifth transistors N4 and N5 according to the scan directions. On the other hand, descriptions for other elements identical to those in the first embodiment of the present invention will be omitted.

Figure 11:
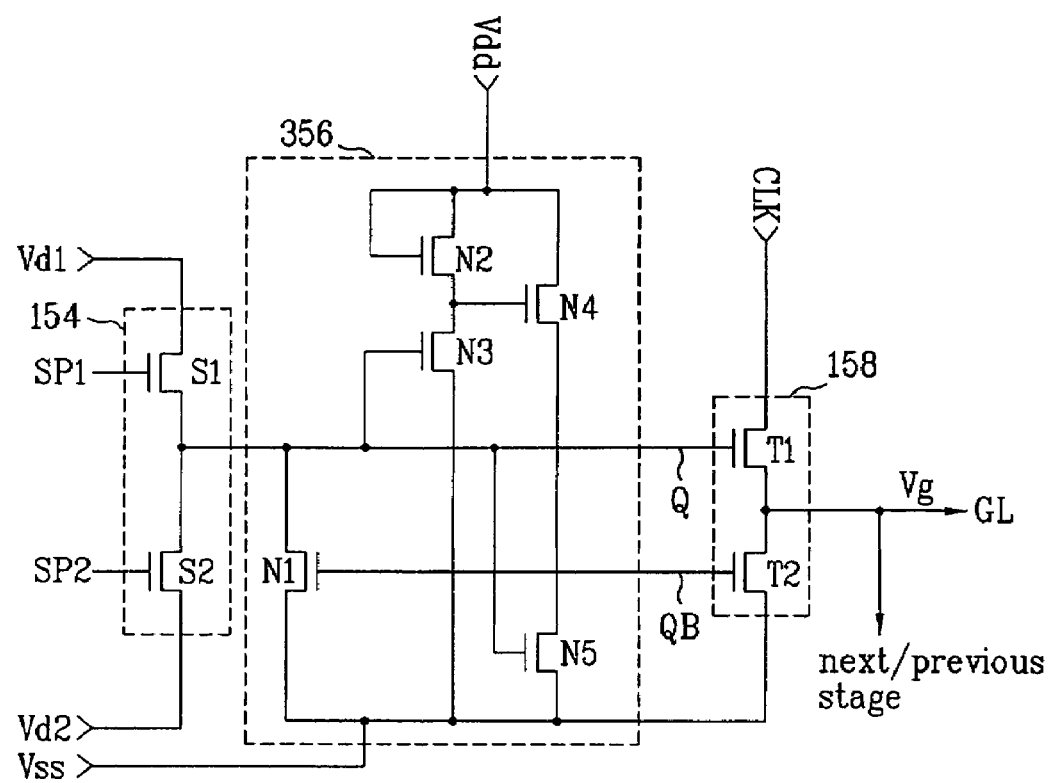
FIG. 11 illustrates a circuit of one of the plurality of stages in the shift register according to a third embodiment of the present invention.

FIG. 11 illustrates an exemplary circuit of one of a plurality of stages in a shift register according to the third embodiment of the present invention. As shown in FIG. 11, the stage of the shift register includes first and second voltage input lines to which first and second voltages Vd1 and Vd2 are provided, respectively, a drive voltage input line to which a drive voltage Vdd is provided, a ground voltage input line to which a ground voltage Vss is provided, first and second start pulse input lines to which first and second start pulses SP1 and SP2 are provided, respectively, a clock signal input line to which a clock signal is provided, a scan direction controller 154, a node controller 356, and an output unit 158. Since the circuit elements of the stage of the shift register according to the third embodiment of the present invention are the same as those of the first embodiment of the present invention in FIG. 7, except for the node controller 356, descriptions for the identical circuit elements will be omitted.

The node controller 356 included in the third embodiment of the present invention includes first to fifth transistors N1~N5 to control voltages of the first and second nodes Q and QB according to the voltage of the first node Q. The first transistor N1 is connected between the first node and the ground voltage input line to provide the ground voltage Vss to the first node Q according to the voltage of the second node QB, thereby discharging the voltage of the first node Q. The second transistor N2 forming a diode circuit is connected to the drive voltage input line to provide the drive voltage to the third transistor N3. The third transistor N3 is connected between the second transistor N2 and the ground voltage input line to connect the second transistor N2 to the ground voltage input line according to the voltage of the first node Q. The fourth transistor N4 is connected between the drive voltage input line and the second node QB to provide the drive voltage Vdd to the second node QB according to the output voltage of the second transistor N2. The fifth transistor N5 is connected between the second node QB and the ground voltage input line to connect the second node QB to the ground voltage input line according to the voltage of the first node Q.

As described above, since the first and third embodiments of the present invention are generally the same as each other except for the node controller 356 of the third embodiment, only operations of the node controller 356 will be described. Namely, the node controller 356 charges or discharges the voltage of the second node QB through the second to fifth transistor N2~N5, according to scan directions. Therefore, charge and discharge of the first and second nodes Q and QB by the node controller 356 will be described in detail as follows. In a state where the shift register of the third embodiment of the present invention is operated in the forward direction, the node controller 356 charges and discharges the voltage of each of the first and second nodes Q and QB as follows.

When the first voltage Vd1 of a high level is provided to the first node Q by the scan direction controller 154, the node controller 356 is operated such that the third and fifth transistors N3 and N5 are turned on by the high first voltage Vd1 provided to the first node Q. Thus, the fourth transistor N4 is turned off by the ground voltage Vss, which is provided to the gate of the fourth transistor N4 through the third transistor N3. Therefore, the voltage of the second node QB is discharged by the ground voltage Vss, which is provided to the second node QB through the fifth transistor N5, such that it becomes low leveled. Also, when a low level second voltage Vd2 is provided to the first node Q by the scan direction controller 154, the node controller 356 is operated such that the third and fifth transistors N3 and N5 are turned off by the low second voltage Vd2 provided to the first node Q. Thus, the fourth transistor N4 is turned on by the drive voltage Vdd from the second transistor N2. Therefore, the voltage of the second node QB is charged with the drive voltage Vdd through the fourth transistor.

On the other hand, in a state where the shift register of the third embodiment of the present invention is operated in the reverse direction, the node controller 356 charges and discharges the voltage of each of the first and second nodes Q and QB as follows. When a second voltage Vd2 of a high level is provided to the first node Q by the scan direction controller 154, the node controller 356 is operated such that the third and fourth transistors N3 and N5 are turned on by the high second voltage Vd2 provided to the first node Q. The fourth transistor N4 is turned off by the ground voltage Vss provided to the gate of the fourth transistor N4 through the third transistor N3. Therefore, the voltage of the second node QB is discharged by the ground voltage Vss, which is provided to the second node QB through the fifth transistor N5, such that it becomes low leveled.

Also, when a low level first voltage Vd1 is provided to the first node Q by the scan direction controller 154, the node controller 356 is operated such that the third and fifth transistors N3 and N5 are turned off by the low first voltage Vd1 provided to the first node Q. And the fourth transistor N4 is turned on by the drive voltage of the second transistor N2. Therefore, the second node QB is charged with the drive voltage Vdd through the fourth transistor N4. Therefore, the stage of the shift register according to the third embodiment of the present invention can perform both forward and reverse direction scans according to the voltage of each of the first and second nodes Q and QB by the node controller 356.

Figure 12:
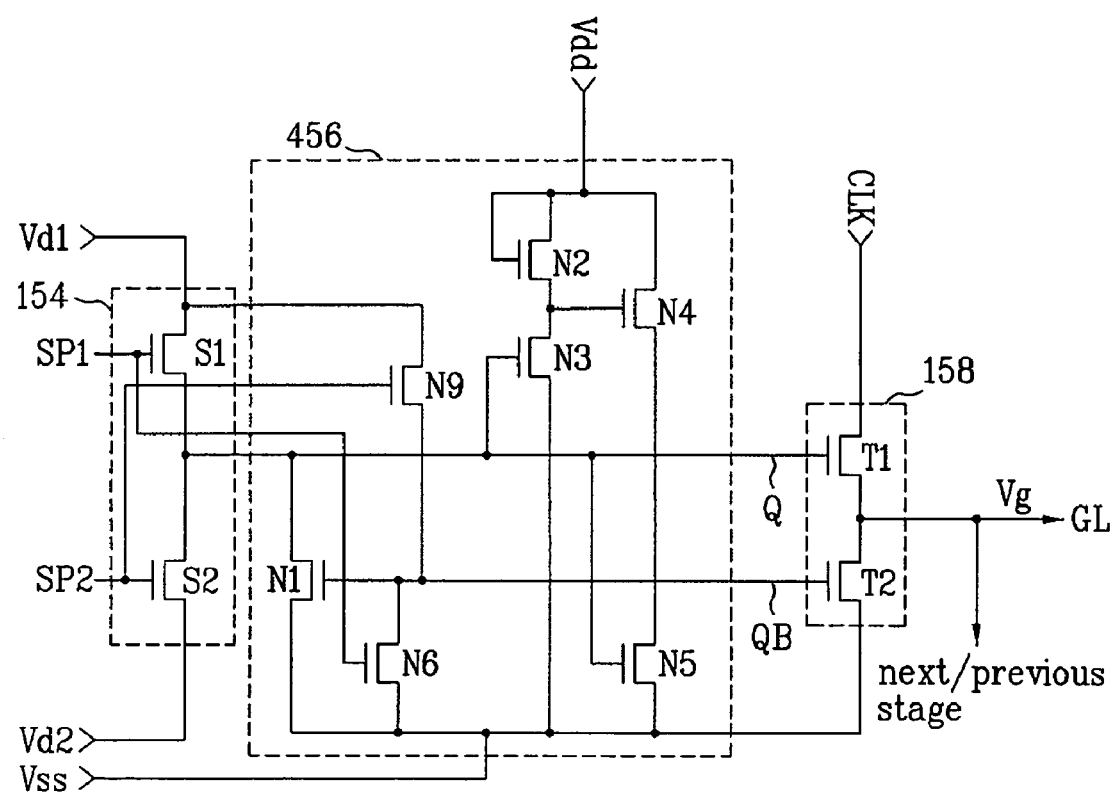
FIG. 12 illustrates a circuit of one of the plurality of stages in the shift register according to a fourth embodiment of the present invention.

FIG. 12 illustrates an exemplary circuit of one of a plurality of stages in a shift register according to the fourth embodiment of the present invention. As shown in FIG. 12, the stage of the shift register includes first and second voltage input lines to which first and second voltages Vd1 and Vd2 are provided, respectively, a drive voltage input line to which a drive voltage Vdd is provided, a ground voltage input line to which a ground voltage Vss is provided, first and second start pulse input lines to which first and second start pulses SP1 and SP2 are provided, respectively, a clock signal input line to which a clock signal is provided, a scan direction controller 154, a node controller 456, and an output unit 158. Since the circuit elements of the stage of the shift register according to the fourth embodiment of the present invention are generally the same as those of the first embodiment of the present invention of FIG. 7, except for the node controller 456, descriptions for the identical circuit elements will be omitted.

The node controller 456 included in the second embodiment of the present invention includes first to seventh transistors N1~N7 to control voltages of first and second nodes Q and QB according to a voltage of the first node Q. The first transistor N1 is connected between the first node Q and the ground voltage input line to provide the ground voltage Vss to the first node Q according to the voltage of the second node QB, thereby discharging the voltage of the first node Q. The second transistor N2 forming a diode circuit is connected to the drive voltage input line to provide the drive voltage Vdd to the third transistor N3. The third transistor N3 is connected between the second transistor N2 and the ground voltage input line to connect the second transistor N2 to the ground voltage input line according to the voltage of the first node Q. The fourth transistor N4 is connected between the drive voltage input line and the second node QB to provide the drive voltage Vdd to the second node QB according to the output voltage of the second transistor N2. The fifth transistor N5 is connected between the second node QB and the ground voltage input line to connect the second node QB to the ground voltage input line according to the voltage of the first node Q. The sixth transistor N6 is connected between the second node QB and the second voltage input line to provide the second voltage Vd2 to the second node QB according to the first start pulse SP1. The seventh transistor N7 is connected between the second node QB and the first voltage input line to provide the first voltage Vd1 to the second node QB according to the second start pulse SP2.

The first to fifth transistors N1~N5 in the node controller 456 are operated like those in the node controller 356 according to the third embodiment of the present invention, as shown in FIG. 11. Also, the sixth and seventh transistors N6 and N7 in the node controller 456 are operated like those in the node controller 256 of the second embodiment of the present invention, as shown in FIG. 10. Therefore, a detailed description for operations of the node controller 456 can be deduced from the operations of the node controllers 256 and 356, which are the second and third embodiments according to the present invention, and thus such a description will be omitted.

Figure 13:
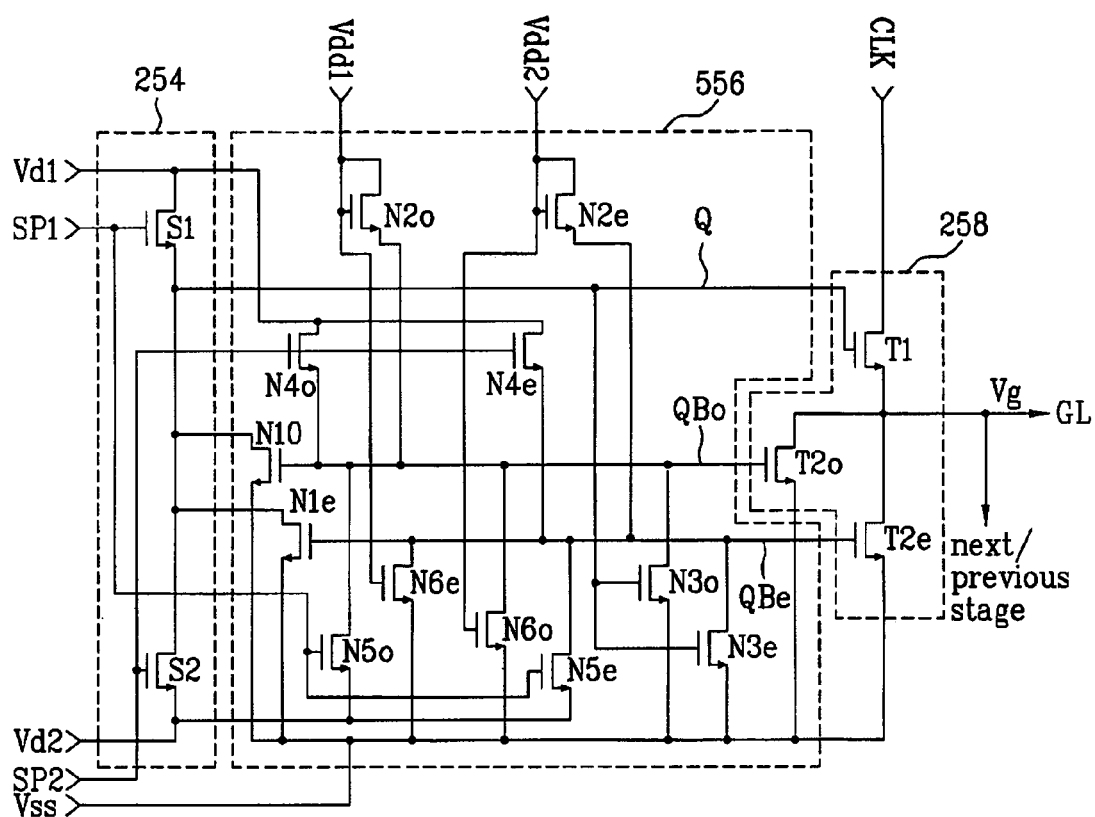
FIG. 13 illustrates a circuit of one of the plurality of stages in the shift register according to a fifth embodiment of the present invention.

FIG. 13 illustrates an exemplary circuit of one of the plurality of stages in a shift register according to the fifth embodiment of the present invention. As shown in FIG. 13, the stage of the shift register includes first and second voltage input lines to which first and second voltages Vd1 and Vd2 are provided, respectively, first and second drive voltage input lines to which first and second drive voltages Vdd1 and Vdd2 are provided, a ground voltage input line to which a ground voltage Vss is provided, first and second start pulse input lines to which first and second start pulses SP1 and SP2 are provided, respectively, a clock signal input line to which a clock signal CLK is provided, a scan direction controller 254, a node controller 556, and an output unit 258.

The first and second voltage input lines input first and second voltages Vd1 and Vd2 from an external side according to scan directions, in which phase of the first and second voltages are opposite to each other. Also, the first and second drive voltage input lines input the first and second drive voltages Vdd1 and Vdd2 whose phases are reversed based on frame units to be opposite to each other. The first and second start pulse input lines input the first and second start pulses SP1 and SP2 according to scan directions. The first start pulse input line inputs an output signal from an external side or a previous stage, and the second start pulse input line inputs an output signal from an external side or a next stage.

The scan direction controller 254 includes a first switching element S1 for providing the first voltage Vd1 to the first node Q according to the first start pulse SP1, in which the first switching element S1 is connected between the first voltage input line and the first node Q of the node controller 556, and a second switching element S2 for providing the second voltage Vd2 to the first node Q according to the second start pulse SP2, in which the second switching element S2 is connected between the second voltage input line and the first node Q of the node controller 556. The first switching element S1 is turned on by the first start pulse SP1 of a high level to provide the first voltage Vd1 to the first node Q. The second switching element S2 is turned on by the start pulse SP2 of a high level to provide the second voltage Vd2 to the first node Q. The node controller 556 includes a first node Q, a second node QBo, and a third node QBe, which are connected to the output unit 258. Also, the node controller 556 includes a first node controller for controlling a voltage of the first node Q, a second node controller for controlling a voltage of the second node QBo, and a third node controller for controlling a voltage of the third node QBe.

The first node controller includes an odd first transistor N1o for controlling a voltage of the first node Q according to a voltage of the second node QBo, and an even first transistor N1e for controlling a voltage of the first node Q according to a voltage of the third node QBe. The odd first transistor N1o is connected between the first node Q and the ground voltage input line to provide the ground voltage Vss to the first node Q according to a voltage of the second node QBo. The even first transistor N1e is connected between the first node Q and the ground voltage input line to provide the ground voltage Vss to the first node Q according to a voltage of the third node QBe.

The second node controller includes odd second to sixth transistor N2o~N6o to control a voltage of the second node QBo according to the first and second start pulses SP1 and SP2, the first and second voltage Vd1 and Vd2, and the first and second drive voltages Vdd1 and Vdd2. The odd second transistor N2o forming a diode circuit is connected to the first drive voltage input line to provide the first drive voltage Vdd1 to the second node QBo. The odd third transistor N3o is connected between the ground voltage input line and the second node QBo to provide the ground voltage Vss to the second node QBo according to a voltage of the first node Q. The odd fourth transistor N4o is connected between the first voltage input line and the second node QBo to provide the first voltage Vd1 to the second node QBo according to the second start pulse SP2. The odd fifth transistor N5o is connected between the second voltage input line and the second node QBo to provide the second voltage Vd2 to the second node QBo according to the first start pulse SP1. The odd sixth transistor N6o is connected between the ground voltage input line and the second node QBo to provide the second voltage Vd2 to the second node QBo.

The third node controller includes even second to sixth transistor N2e~N6e to control a voltage of the third node QBe according to the first and second start pulses SP1 and SP2, the first and second voltage Vd1 and Vd2, and the first and second drive voltages Vdd1 and Vdd2. The even second transistor N2e forming a diode circuit is connected to the second drive voltage input line to provide the second drive voltage Vdd2 to the third node QBe. The even third transistor N3e is connected between the ground voltage input line and the third node QBe to provide the ground voltage Vss to the third node QBe according to the voltage of the first node Q. The even fourth transistor N4e is connected between the first voltage input line and the third node QBe to provide the first voltage Vd1 to the third node QBe according to the second start pulse SP2. The even fifth transistor N5e is connected between the second voltage input line and the third node QBe to provide the second voltage Vd2 to the third node QBe according to the first start pulse SP1. The even sixth transistor N6e is connected between the ground voltage input line and the third node QBe to provide the ground voltage Vss to the third node QBe according to the first drive voltage Vdd1.

The output unit 258 includes a first switch T1, odd second switch T2o and even second switch T2e. The first switch T1 is connected between a clock signal input line and an output lead to output the clock signal to the output lead according to the voltage of the first node Q. The odd second transistor T2o is connected between the ground input line and the output lead to output the ground voltage Vss to the output lead according to the voltage of the second node QBo. The even second transistor T2e is connected between the ground voltage input line and the output lead to output the ground voltage Vss to the output lead according to the voltage of the third node QBe. Based on such a configuration of the shift register according to the fifth embodiment of the present invention, the forward and reverse direction scans are described in detail below.

First, the stage is operated differently according to the forward and reverse direction scans and according to odd and even frames. The operation of the stage for an odd frame in forward direction scan will now be described.

Regarding an odd frame in forward direction scan, the first voltage input line inputs a first voltage Vd1 of a high level from an external side or a previous stage, but the second voltage input line inputs a second voltage Vd2 of a low level from an external side or a next stage. Also, the first start pulse input line inputs a first start pulse SP1 of a high level, but the second start pulse input line inputs a second start pulse SP2 of a low level. In addition, the first drive voltage input line inputs a first drive voltage Vdd1 of a high level, but the second drive voltage input line inputs a second drive voltage Vdd2 of a low level. In such a state, the scan direction controller 254 is operated such that the first switching element S1 is turned on by the first start pulse SP1 of a high level, and the second switching element S2 is turned off by the second start pulse SP2 of a low level. Thus, the scan direction controller 254 can provide the first voltage Vd1 of a high level to the first node Q of the node controller 556 through the first switching element S1.

Afterwards, the node controller 556 is operated such that the first node Q is charged with the first voltage Vd1 of a high level, which is provided from the scan direction controller 254. The odd and even third transistors N3o and N3e are simultaneously turned on by the charged voltage of the first node Q such that the odd third transistor N3o can provide the ground voltage Vss to the second node QBo and the even third transistor N3e can provide the ground voltage Vss to the third node QBe. The odd and even fifth transistors N5o and N5e are turned on according to the first start pulse SP1 of a high level to provide the second voltage Vd2 of a low level to the second and third nodes QBo and QBe, respectively.

After that, the output unit 258 is operated such that the first switch T1 is turned on by the high first voltage Vd1, which is charged at the first node Q. And the odd and even second switches T2o and T2e are turned off by the ground voltage Vss of the second and third nodes QBo and QBe. Therefore, the output unit 258 can output the high clock signal CLK provided through the first switch T1, as an output signal Vg, to the output lead.

As such, after the high output signal Vg is output from the output unit of the stage, the stage inputs a first start pulse SP1 of a low level, and a second start pulse SP2 of a high level. Therefore, the scan direction controller 254 is operated such that the first switching element S1 is turned off according to the low first start pulse SP1 and the second switching element S2 is turned on according to the high second start pulse SP2. Therefore, the scan direction controller 254 can provide the low second voltage Vd2 to the first node Q of the node controller 556 through the second switching element S2.

Afterwards, the node controller 556 is operated as follows. The voltage of the first node Q is discharged to be a low level by the low second voltage Vd2 provided from the scan direction controller 254. The odd and even third transistors N3o and N3e are simultaneously turned off according to the voltage of the first node Q. The odd and even fourth transistors N4o and N4e are simultaneously turned of according to the high second start pulse SP2 such that the high first voltage Vd1 can be provided to the second and third nodes QBo and QBe, respectively. The odd second transistor N2o provides the high first drive voltage Vdd1 to the second node QBo. And the even sixth transistor N6e is turned on by the high first drive voltage Vdd1 to provide the ground voltage Vss to the third node QBe.

After that, the output unit 258 is operated as follows. The odd second switch T2o is turned on by the high drive voltage Vdd, which is provided to the second node QBo by the node controller 556. The first switch T1 is turned off by the voltage of the first node Q. And the even switch T2e maintains the turned-off state by the ground voltage Vss of the third node QBe. Therefore, the output unit 258 can output the low output signal Vg by the ground voltage Vss provided through the odd second switch T2o. As a result, the stage for an odd frame in forward direction scan can output the low output signal Vg according to operations of the second node controller.

On the other hand, the following is a description of operations of the stage for an even frame in forward direction scan. Now, an even frame in forward direction scan will be described. The first voltage input line inputs a first voltage Vd1 of a high level from an external side or a previous stage, but the second voltage input line inputs a second voltage Vd2 of a low level from an external side or a next stage. Also, the first start pulse input line inputs a first start pulse SP1 of a high level, but the second start pulse input line inputs a second start pulse SP2 of a low level. In addition, the first drive voltage input line inputs a low first drive voltage Vdd1, but the second drive voltage input line inputs a high drive voltage Vdd2.

The stage for an even frame in forward direction scan outputs a high output signal Vg as it is operated like the stage for odd frame in forward direction scan, except that the stage for an even frame in forward direction scan controls a voltage of the third node QBe according to the high second drive voltage Vdd2 to output a low output signal Vg. Consequently, the stage for an even frame in forward direction scan can output a low output signal Vg according to operations of the third node controller.

On the other hand, the following is a description of operations of the stage for an odd frame in reverse direction scan. Let us consider an odd frame in reverse direction scan. The first voltage input line inputs a first voltage Vd1 of a low level from an external side or a previous stage, but the second voltage input line inputs a second voltage of a high level from an external side or a next stage. Also, the first start pulse input line inputs a first start pulse SP1 of a low level, but the second start pulse input line inputs a second start pulse SP2 of a high level. In addition, the first drive voltage input line inputs a first drive voltage Vdd1 of a high level, but the second drive voltage input line inputs a second drive voltage Vdd2 of a low level. In such a state, the scan direction controller 254 is operated as follows. The first switching element S1 is turned off according to the low start pulse SP1. And the second switching element S2 is turned on according to the high start pulse SP2. Therefore, the scan direction controller 254 can provide the high second voltage Vd2 to the first node Q of the node controller 556 through the second switching element S2.

Afterwards, the node controller 556 is operated as follows. The first node Q is charged with the high second voltage Vd2 provided from the scan direction controller 254. The odd and even third transistors N3o and N3e are simultaneously turned on by the charged voltage of the first node Q such that the odd third transistor N3o can provide the ground voltage Vss to the second node QBo and the even third transistor N3e can provide the ground voltage Vss to the third node QBe. The odd and even fourth transistors N4o and N4e are turned on according to the high second start pulse SP2 to provide the low first voltage Vd1 to the second and third nodes QBo and QBe, respectively.

The output unit 258 is operated as follows. The first switch T1 is turned on by the high second voltage Vd2, which is charged at the first node Q by the node controller 556. And the odd and even second switches T2o and T2e are turned off by the ground voltage Vss of the second and third nodes QBo and QBe. Therefore, the output unit 258 can provide the high clock signal CLK provided through the first switch T1, as an output signal Vg, to the output lead. As such, after the high output signal Vg is output from the output unit of the stage, the stage inputs a first start pulse SP1 of a high level and a second start pulse SP2 of a low level. Therefore, the scan direction controller 254 is operated such that the first switching element S1 is turned on according to the high first start pulse SP1 and the second switching element S2 is turned off according to the low start pulse SP2. Therefore, the scan direction controller 254 can provide the low first voltage Vd1 to the first node Q of the node controller 556 through the first switching element S1.

Afterwards, the node controller 556 is operated as follows. The voltage of the first node Q is discharged to be a low level by the low first voltage Vd1 provided from the scan direction controller 254. The odd and even third transistors N3o and N3e are simultaneously turned off according to the voltage of the first node Q. The odd and even fifth transistors N5o and N5e are simultaneously turned on according to the high first start pulse SP1 such that the high second voltage Vd2 can be provide to the second and third node QBo and QBe, respectively. The odd second transistor N2o provides the high first drive voltage Vdd1 to the second node QBo and the even sixth transistor N6e is turned on by the high first drive voltage Vdd1 to provide the ground voltage Vss to the third node QBe.

After that, the output unit 258 is operated as follows. The odd second switch T2o is turned on by the high drive voltage Vdd1 provided to the second node QBo by the node controller 556. The first switch T1 is turned off by the voltage of the first node Q. And the even switch T2e maintains the turned-off state by the ground voltage Vss of the third node QBe. Therefore, the output unit 258 can output the low output signal Vg by the ground voltage Vss provided through the odd second switch T2o. As a result, the stage for odd frame in reverse direction scan can output the low output signal Vg according to operations of the second node controller.

In contrast, the operation of the stage for an even frame in reverse direction scan will now be described. In particular, an even frame in reverse direction scan will now be described. The first voltage input line inputs a first voltage Vd1 of a low level from an external side or a previous stage, but the second voltage input line inputs a second voltage Vd2 of a high level from an external or a next stage. Also, the first start pulse input line inputs a first start pulse SP1 of a low level and the second start pulse input line inputs a second start pulse SP2 of a high level. In addition, the first drive voltage input line inputs a low first drive voltage Vdd1, but the second drive voltage input line inputs a high drive voltage Vdd2.

The stage for an even frame in the reverse direction scan outputs a high output signal Vg as it is operated like the stage for odd frame in reverse direction scan, except that the stage for an even frame in reverse direction scan controls a voltage of the third node QBe according to the high second drive voltage Vdd2 to output a low output signal Vg. Consequently, the stage for an even frame in reverse direction scan can output a low output signal Vg according to operations of the third node controller. As such, the stage of the shift register according to the fifth embodiment of the present invention can perform the forward and reverse direction scans, using first and second start pulses SP1 and SP2, and the first and second voltages Vd1 and Vd2 whose phases are opposite to one another. Also, the stage alternatively controls voltages of the second and third nodes QBo and QBe based on frame units, such that bias stress, which is applied to the transistors according to clock signals, can be minimized, thereby preventing malfunction thereof.

Figure 14:
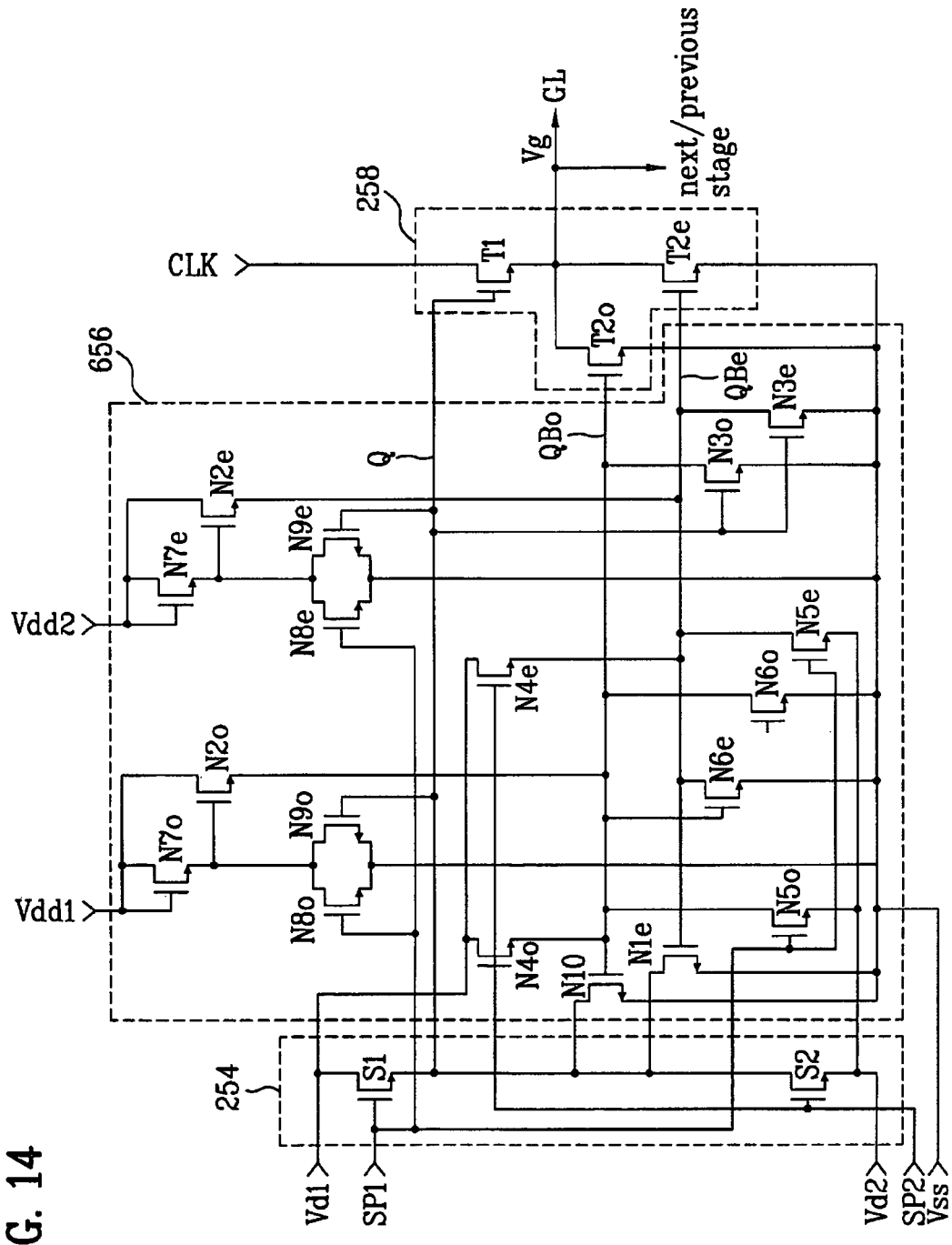
FIG. 14 illustrates a circuit of one of the plurality of stages in the shift register according to a seventh embodiment of the present invention.

FIG. 14 illustrates a circuit of one of a plurality of stages in the shift register according to the seventh embodiment of the present invention. As shown in FIG. 14, the stage of the shift register includes first and second voltage input lines to which first and second voltages Vd1 and Vd2 are provided, respectively, first and second drive voltage input lines to which first and second drive voltages Vdd1 and Vdd2 are provided respectively, a ground voltage input line to which a ground voltage Vss is provided, first and second start pulse input lines to which first and second start pulses SP1 and SP2 are provided, respectively, a clock signal input line to which a clock signal CLK is provided, a scan direction controller 254, a node controller 656, and an output unit 258. Since the circuit elements of the stage of the shift register according to the seventh embodiment of the present invention are the same as those in the fifth embodiment of FIG. 13, except for the node controller 656, descriptions for the same circuit elements will be omitted. Furthermore, since the node controller 656 included in the stage in the seventh embodiment has the same circuit elements that of the node controller 556 of the fifth embodiment of FIG. 13, except for the second and third node controllers, descriptions for the same circuit elements will be omitted.

The second node controller of the node controller 656 includes an odd second transistor N2o ~an odd ninth transistor N9o to control the voltage of the second node QBo according to the first and second start pulses SP1 and SP2, the first and second voltages Vd1 and Vd2, and the first and second drive voltage Vdd1 and Vdd2. The odd seventh transistor N7o forming a diode circuit is connected to the first drive voltage input line to output the first drive voltage Vdd1 thereto. The odd second transistor N2o, which forms a diode circuit according to the operation of the odd seventh transistor N7o, is connected to the first drive voltage Vdd1 in order to provide the first drive voltage Vdd1 to the second node QBo. The odd third to sixth transistors N3o~N6o are configured as those of the node controller 556 in FIG. 13. Therefore, descriptions for the odd third to sixth transistors N3o~N6o will be omitted. The odd eighth transistor N8o is connected between the odd seventh transistor N7o and the ground voltage input line to connect the gate of the odd second transistor N2o to the ground voltage input line according to the first start pulse SP1. The odd ninth transistor N9o is connected between the odd seventh transistor N7o and the ground input line to connect the gate of the odd second transistor N2o to the ground voltage input line according to the voltage of the first node Q.

The third node controller of the node controller 656 includes an even second to ninth transistors N2e~N9e to control the voltage of the third node QBe according to the first and second start pulses SP1 and SP2, the first and second voltages Vd1 and Vd2, and the first and second drive voltages Vdd1 and Vdd2. The even seventh transistor N7e forming a diode circuit is connected to the second drive voltage input line to output the second drive voltage Vdd2 thereto. The even second transistor N2e, which forms a diode circuit according to the operation of the even seventh transistor N7e, is connected to the second drive voltage input line in order to provide the second drive voltage Vdd2 to the third node QBe. The even third to sixth transistors N3e~N6e are configured as those of the node controller 556 of FIG. 13. Therefore, descriptions for the even third to sixth transistors N3e~N6e will be omitted. The even eighth transistor N8e is connected between the seventh transistor N7e and the ground voltage input line in order to connect the gate of the even second transistor N2e to the ground voltage input line according to the first start pulse SP1. The even ninth transistor N9e is connected between the even seventh transistor N7e and the ground input line to connect the gate of the even second transistor 2Ne to the ground voltage input line according to the voltage of the first node Q.

As such, the stage of the shift register according to the seventh embodiment of the present invention can output a low output signal Vg, except that the stage of the seventh embodiment outputs a high output signal Vg as the stage is operated similar to the stage of the fifth embodiment of the present invention. When a low output signal Vg is output in an odd frame, the stage is operated such that the odd eighth and ninth transistors N8o and N9o are controlled by the first start pulse SP1 or the voltage of the first node Q of the second node controller. Thus the odd second transistor N2o is turned off. Therefore, the first drive voltage Vdd1 is not provided to the second node QBo. When a low output signal Vg is output in an even frame, the stage is operated such that the even eighth and ninth transistors N8e and N9e are controlled by the first start pulse SP1 or the voltage of the first node Q of the third node controller. Thus, the even second transistor N2e is turned off. Therefore, the second drive voltage Vdd2 is not provided to the third node QBe.

As such, the stage of the shift register according to the seventh embodiment of the present invention can perform the forward and reverse direction scans, using the first and second start pulses SP1 and SP2, and the first and second voltages Vd1 and Vd2 whose phases are opposite to one another. Also, the stage alternatively controls voltages of the second and third nodes QBo and QBe based on frame units, such that bias stress, which is applied to the transistors according to clock signals, can be minimized, thereby preventing malfunction thereof.

Figure 15:
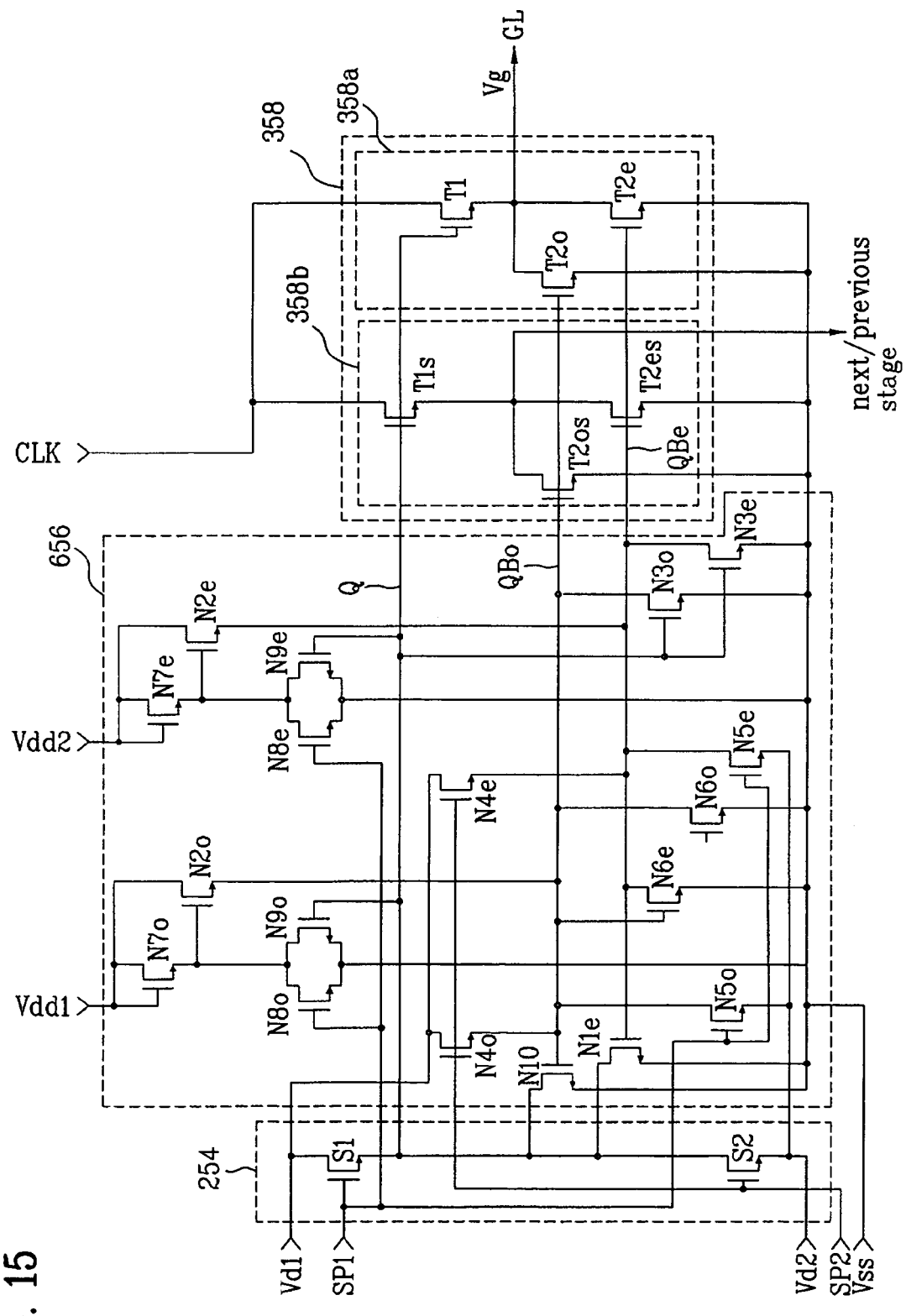
FIG. 15 illustrates a circuit of one of the plurality of stages in the shift register according to a seventh embodiment of the present invention.

FIG. 15 illustrates a circuit of one of a plurality of stages in a shift register according to the seventh embodiment of the present invention. As shown in FIG. 15, the stage of the shift register includes first and second voltage input lines to which first and second voltages Vd1 and Vd2 are provided, respectively, first and second drive voltage input lines to which first and second drive voltages Vdd1 and Vdd2 are provided, respectively, a ground voltage input line to which a ground voltage Vss is provided, first and second start pulse input lines to which first and second start pulses SP1 and SP2 are provided, respectively, a clock signal input line to which a clock signal CLK is provided, a scan direction controller 254, a node controller 656, and an output unit 358. Since the circuit elements of the stage of the shift register according to the seventh embodiment of the present invention are the same as those of the seventh embodiment of FIG. 14, except for the output unit 358, descriptions for the same circuit elements will be omitted.

The output unit 358 included in the seventh embodiment of the present invention includes a first output unit 358a to output a clock signal CLK to the first output lead according to voltages of the first node Q, second node QBo, and the third node QBe, and the second output unit 358b to output a clock signal CLK to the second output lead according to voltages of the first node Q, second node QBo, and the third node QBe. The first output unit 358a includes a first switch T1, an odd second switch T2o, and an even second switch T2e. The first switch T1 is connected between the clock signal input line and the first output lead to provide the clock signal CLK to the first output lead according to the voltage of the first node Q. The odd second switch T2o is connected between the ground voltage input line and the first output lead to provide the ground voltage to the first output lead according to the voltage of the second node QBo. The even second switch T2e is connected between the ground voltage input line and the first output lead to provide the ground voltage Vss to the first output lead according to the voltage of the third node QBe. The second output unit 358b includes a first auxiliary switch T1s, a second auxiliary switch T2os, and an even second auxiliary switch T2es. The first auxiliary switch T1s is connected between the clock signal input line and the second output lead to provide the clock signal CLK to the second output lead according to the voltage of the first node Q. The odd second auxiliary switch T2os is connected between the ground voltage input line and the second output lead to provide the ground voltage Vss to the second output lead according to the voltage of the second node QBo. The even second auxiliary switch T2es is connected between the ground voltage input line and the second output lead to provide the ground voltage Vss to the second output lead according to the voltage of the third node QBe.

As such, according to the voltages of the first node Q, second node QBo, and the third node QBe, the output unit 358 outputs the high clock signal CLK to the output lead and then outputs the ground voltage Vss to the output lead, as the first switch T1, and the odd and even second switches T2o and T2e are controlled. Simultaneously, the output unit 358 outputs the high clock signal CLK to the output lead and then outputs the ground voltage Vss to previous and next stages, as the first auxiliary switch T1s, and the odd and even auxiliary second switches T2os and T2es are controlled.

As described above, the stage of the shift register according to the seventh embodiment of the present invention is operated similar to that of the seventh embodiment, except for the output unit 358. On the other hand, the shift registers according to the embodiments of the present invention can perform forward and reverse direction scans as first and second voltages whose phases are opposite to one another are selectively output thereto, according to output signals from previous and next stages. Thus, the shift registers according to the embodiments of the present invention can be applied to image display apparatuses, such as LCD devices.

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

What is claimed is:

1. A shift register, comprising:
    first and second voltage input lines to which first and second voltages are input, respectively with the phases of the first and second voltages being opposite to each other;
    a plurality of stages dependently connected to a plurality of clock signal input lines which input a plurality of clock signals whose phases are sequentially delayed, wherein each stage includes:
       a scan direction controller to selectively output the first and second voltages thereto, according to first and second start pulses, and for controlling scan direction,
       a node controller to control voltages of first and second nodes according to a signal output from the scan direction controller, and
       an output unit to output a clock signal from one of the plurality of clock signal input lines thereto according to the voltage of each of the first and second nodes.

2. The shift register as set forth in claim 1, wherein the first start pulse is an output signal output from a previous stage, and the second start pulse is an output signal output from a next stage.

3. The shift register as set forth in claim 2, wherein the first start pulse is provided from an external side or a dummy stage, such that the first start pulse is provided to a first stage of the plurality of stages, and the second start pulse is provided from the external side or the dummy stage, in which the second start pulse is provided to the last stage of the plurality of stages.

4. The shift register as set forth in claim 1, wherein the scan direction controller includes:
    a first switching element to provide the first voltage to the node controller according to the first start pulse; and
    a second switching element to provide the second voltage to the node controller according to the second start pulse.

5. The shift register as set forth in claim 1, wherein the node controller includes:
    the first node to input the first voltage or the second voltage from the scan direction controller;
    a first transistor to connect the first node to a ground voltage input line to which a ground voltage is input according to the voltage of the second node;
    a second transistor to provide a drive voltage to the second node such that the second transistor forming a diode circuit is connected to a drive voltage input line to which the drive voltage is input; and
    a third transistor to connect the second node to the ground voltage input line according to the voltage of the first node.

6. The shift register as set forth in claim 5, wherein the node controller includes a fourth transistor to connect the second node to the second voltage input line according to the first start pulse, and a fifth transistor to connect the second node to the first voltage input line according to the second start pulse.

7. The shift register as set forth in claim 1, wherein the node controller includes:
    the first node to input the first voltage or the second voltage from the scan direction controller;
    a first transistor to connect the first node to a ground voltage input line to which a ground voltage is input according to the voltage of the second node;
    a second transistor to output a drive voltage thereto such that the second transistor forming a diode circuit is connected to a drive voltage input line to which the drive voltage is input;
    a third transistor to connect the second transistor to the ground voltage input line according to the voltage of the first node;
    a fourth transistor to provide the drive voltage to the second node such that the fourth transistor forming a diode circuit is connected to the drive voltage input line through the second transistor; and
    a fifth transistor to connect the second node to the ground voltage input line according to the voltage of the first node.

8. The shift register as set forth in claim 7, wherein the node controller includes:
    a seventh transistor to connect the second node to the second voltage input line according to the first start pulse; and
    a seventh transistor to connect the second node to the first voltage input line according to the second start pulse.

9. The shift register as set forth in claim 1, wherein the output unit includes:
    a first switch to provide the clock signal to an output lead according to the voltage of the first node; and
    a second switch to provide the ground voltage to the output lead according to the voltage of the second node.

10. The shift register as set forth in claim 1, wherein the first and second voltages change their phases to be opposite to each other according to the scan direction.

11. A shift register, comprising:
    first and second voltage input lines to which first and second voltages are input, respectively, such that the phases of the first and second voltages are opposite to each other;
    first and second drive voltage input lines to which first and second drive voltages are provided, respectively, in which phases of the first and second drive voltages are opposite to each other based on frame units; and
    a plurality of stages which are dependently connected to a plurality of clock signal input lines, inputting a plurality of clock signals whose phases are sequentially delayed, wherein each stage includes:
       a scan direction controller to selectively output the first and second voltages thereto, according to first and second start pulses, and for controlling scan direction,
       a node controller to control a voltage of each of a first node to a third node according to a signal output from the scan direction controller, and an output unit to output a clock signal from one of the plurality of clock signal input lines thereto, according to the voltage of each of the first node to the third node.

12. The shift register as set forth in claim 11, wherein the first start pulse is an output signal output from a previous stage, and the second start pulse is an output signal output from a next stage.

13. The shift register as set forth in claim 12, wherein the first start pulse is provided from an external side or a dummy stage, such that the first start pulse is provided to a first stage of the plurality of stages, and the second start pulse is provided from the external side or the dummy stage, such that the second start pulse is provided to the last stage of the plurality of stages.

14. The shift register as set forth in claim 11, wherein the scan direction controller includes:
a first switching element for providing the first voltage to the node controller according to the first start pulse; and
a second switching element for providing the second voltage to the node controller according to the second start pulse.

15. The shift register as set forth in claim 11, wherein the node controller includes:
the first node to input the first voltage or the second voltage from the scan direction controller;
a first node controller to control the voltage of the first node according to the voltage of each of the first and second nodes;
a second node controller to control the voltage of the second node according to the first and second voltages, the first and second start pulses, and the first and second drive voltages; and
a third node controller to control the voltage of the first voltage according to the first and second voltages, the first and second start pulses, and the first and second drive voltages.

16. The shift register as set forth in claim 15, wherein the first node controller includes:
a first odd transistor to provide the ground voltage to the first node according to the voltage of the second node; and
a first even transistor to provide the ground voltage to the first node according to the voltage of the third node.

17. The shift register as set forth in claim 15, wherein the second node controller includes:
a second odd transistor to provide the first drive voltage to the second node, in which the second odd transistor forming a diode circuit is connected to the first drive voltage input line;
a third odd transistor to provide the ground voltage to the second node according to the voltage of the first node;
a fourth odd transistor to provide the first voltage to the second node according to the second start pulse;
a fifth odd transistor to provide the second voltage to the second node according to the first start pulse; and
a seventh odd transistor to provide the ground voltage to the second node according to the second drive voltage.

18. The shift register as set forth in claim 17, wherein the second node controller further includes:
a seventh odd transistor to connect the second odd transistor to the first drive voltage input line while the second odd transistor is formed as a diode circuit such that the seventh odd transistor forming a diode circuit is connected to the first drive voltage input line;
an eighth odd transistor to connect the seventh odd transistor to the ground voltage input line to which the ground voltage is provided according to the first start pulse; and
a ninth odd transistor to connect the seventh odd transistor to the ground voltage input line according to the voltage of the first node.

19. The shift register as set forth in claim 15, wherein the third node controller includes:
a second even transistor to provide the second drive voltage to the third node, in which the second even transistor forming a diode circuit is connected to the second drive voltage input line;
a third even transistor to provide the ground voltage to the third node according to the voltage of the first node;
a fourth even transistor to provide the first voltage to the third node according to the second start pulse;
a fifth even transistor to provide the second voltage to the third node according to the first start pulse; and
a seventh even transistor to provide the ground voltage to the third node according to the first drive voltage.

20. The shift register as set forth in claim 19, wherein the third node controller includes:
a seventh even transistor to connect the second even transistor to the second drive voltage input line while the second even transistor is formed as a diode circuit such that the seventh even transistor forming a diode circuit is connected to the second drive voltage input line;
an eighth even transistor to connect the seventh even transistor to the ground voltage input line to which the ground voltage is provided according to the first start pulse; and
a ninth even transistor to connect the seventh even transistor to the ground voltage input line according to the voltage of the first node.

21. The shift register as set forth in claim 11, wherein the output unit includes:
a first switch to provide the clock signal to an output lead according to the voltage of the first node;
a second odd switch to provide the ground voltage to the output lead according to the voltage of the second node; and
a second even switch for providing the ground voltage to the output lead according to the voltage of the third node.

22. The shift register as set forth in claim 11, wherein the output unit includes:
a first output unit to provide the clock signal to a first output lead according to the voltage of each of the first node to the third node; and
a second output unit for providing the clock signal to a second output lead according to the voltage of each of the first node to the third node.

23. The shift register as set forth in claim 22, wherein the first output unit includes:
a first switch to provide the clock signal to the first output lead according to the voltage of the first node;
a second odd switch to provide the ground voltage to the first output lead according to the voltage of the second node; and
a second even switch to provide the ground voltage to the first output lead according to the voltage of the third node.

24. The shift register as set forth in claim 22, wherein the second output unit includes:

a first auxiliary switch to provide the clock signal to the second output lead according to the voltage of the first node;

a second odd auxiliary switch to provide the ground voltage to the second output lead according to the voltage of the second node; and a second even auxiliary switch to provide the ground voltage to the second output lead according to the voltage of the third node.

25. The shift register as set forth in claim 22, wherein the clock signal provided to the first output lead is output to an external side, and the clock signal provided to the second output lead is output to a next stage of a previous stage.

26. The shift register as set forth in claim 11, wherein the first and second voltages change their phases to be opposite to each other according to the scan direction.

* * * * *